United States Patent
Kunitake et al.

(10) Patent No.: US 12,193,236 B2
(45) Date of Patent: Jan. 7, 2025

(54) MEMORY DEVICE AND ELECTRONIC DEVICE

(71) Applicant: Semiconductor Energy Laboratory Co., Ltd., Atsugi (JP)

(72) Inventors: Hitoshi Kunitake, Isehara (JP); Satoru Ohshita, Atsugi (JP); Kazuki Tsuda, Atsugi (JP); Tatsuya Onuki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 341 days.

(21) Appl. No.: 17/772,280

(22) PCT Filed: Nov. 13, 2020

(86) PCT No.: PCT/IB2020/060677
§ 371 (c)(1),
(2) Date: Apr. 27, 2022

(87) PCT Pub. No.: WO2021/105811
PCT Pub. Date: Jun. 3, 2021

(65) Prior Publication Data
US 2022/0375956 A1 Nov. 24, 2022

(30) Foreign Application Priority Data
Nov. 26, 2019 (JP) ................... 2019-213485

(51) Int. Cl.
*H10B 43/40* (2023.01)
*G11C 16/08* (2006.01)
*H10B 43/27* (2023.01)

(52) U.S. Cl.
CPC .............. *H10B 43/40* (2023.02); *G11C 16/08* (2013.01); *H10B 43/27* (2023.02)

(58) Field of Classification Search
CPC ......... H10B 43/40; H10B 43/27; G11C 16/08
See application file for complete search history.

(56) References Cited

U.S. PATENT DOCUMENTS

| 8,338,882 B2 | 12/2012 | Tanaka et al. |
| 8,476,708 B2 | 7/2013 | Fukuzumi et al. |

(Continued)

FOREIGN PATENT DOCUMENTS

| JP | 2011-187794 A | 9/2011 |
| JP | 2012-146861 A | 8/2012 |

(Continued)

OTHER PUBLICATIONS

International Search Report (Application No. PCT/IB2020/060677) Dated Feb. 22, 2021.

(Continued)

*Primary Examiner* — Syed I Gheyas
(74) *Attorney, Agent, or Firm* — Eric J. Robinson; Robinson Intellectual Property Law Office, P.C.

(57) ABSTRACT

A memory device with a small number of wirings using a NAND flash memory having a three-dimensional structure with a large number of stacked memory cell layers is provided. A decoder is formed using an OS transistor. An OS transistor can be formed by a method such as a thin film method, whereby the decoder can be provided to be stacked above the NAND flash memory having a three-dimensional structure. This can reduce the number of wirings provided substantially perpendicular to the memory cell layers.

8 Claims, 17 Drawing Sheets

(56) References Cited

U.S. PATENT DOCUMENTS

| | | | |
|---|---|---|---|
| 9,595,533 | B2 | 3/2017 | Tanzawa et al. |
| 9,818,757 | B2 | 11/2017 | Ikeda et al. |
| 10,608,009 | B2 | 3/2020 | Ikeda et al. |
| 10,665,580 | B1* | 5/2020 | Hosoda ............... H10B 41/41 |
| 10,770,470 | B2 | 9/2020 | Tanzawa et al. |
| 2011/0220987 | A1 | 9/2011 | Tanaka et al. |
| 2012/0181602 | A1 | 7/2012 | Fukuzumi et al. |
| 2015/0076579 | A1 | 3/2015 | Tsuji et al. |
| 2017/0077230 | A1* | 3/2017 | Ikeda ............... H01L 29/78696 |
| 2021/0005624 | A1 | 1/2021 | Tanzawa et al. |

FOREIGN PATENT DOCUMENTS

| | | |
|---|---|---|
| JP | 2015-056642 A | 3/2015 |
| JP | 2015-526910 | 9/2015 |
| JP | 2016-171243 A | 9/2016 |
| JP | 2017-059607 A | 3/2017 |
| KR | 2011-0102100 A | 9/2011 |

OTHER PUBLICATIONS

Written Opinion (Application No. PCT/IB2020/060677) Dated Feb. 22, 2021.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

FIG. 13A
Intermediate state
New crystalline phase
| Amorphous | Crystalline | Crystal |
|---|---|---|
| • completely amorphous | • CAAC<br>• nc<br>• CAC | • single crystal<br>• poly crystal |
FIG. 13B
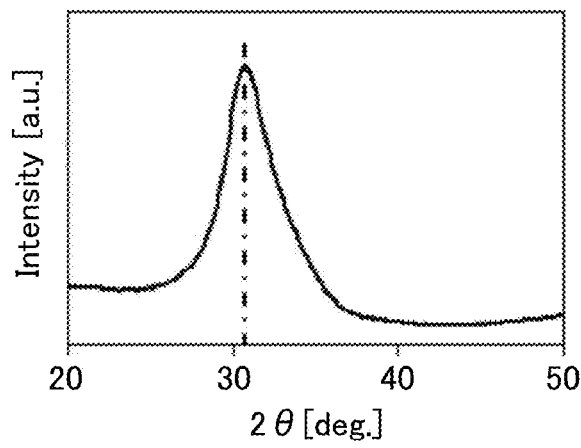
FIG. 13C
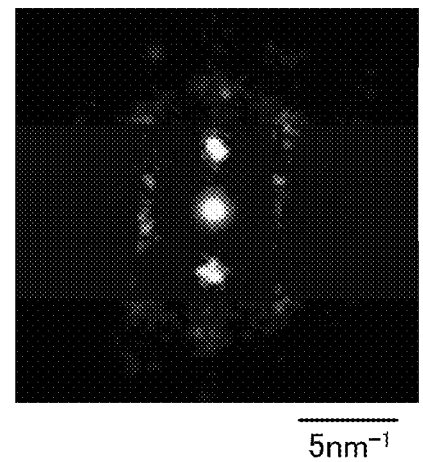

MEMORY DEVICE AND ELECTRONIC DEVICE

TECHNICAL FIELD

The present invention relates to a memory device. In particular, the present invention relates to a NAND flash memory having a three-dimensional structure.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

NAND flash memories are known as solid state drives (SSDs) used for data processing devices such as a personal computer (PC) and a server, and nonvolatile memory devices used for a USB (Universal Serial Bus), an SD card, and the like. In recent years, an increase in storage capacity of a NAND flash memory has been pursued through miniaturization of a semiconductor process, multi-leveling with which one memory cell retains more than 2-bit (4-level) data, three-dimensionalization by stacking a plurality of memory cell layers, or the like.

Meanwhile, a transistor including an oxide semiconductor or a metal oxide in a channel formation region (also referred to as an oxide semiconductor (OS) transistor) is known. An OS transistor has a feature of extremely low drain current in an off state (such a current is also referred to as an off-state current) (e.g., see Non-Patent Documents 1 and 2) and thus has attracting attentions. Since an OS transistor can be formed by a method such as a thin film method, for example, the OS transistor can be provided to be stacked over a transistor formed using a semiconductor substrate.

In addition, a CAAC (c-axis aligned crystalline) structure and an nc (nanocrystalline) structure, which are neither single crystal nor amorphous, have been found in an oxide semiconductor (see Non-Patent Document 1 and Non-Patent Document 3). Non-Patent Document 1 and Non-Patent Document 3 also disclose a technique for manufacturing a transistor using an oxide semiconductor having a CAAC structure.

REFERENCE

Non-Patent Document

[Patent Document 1] S. Yamazaki et al., "Properties of crystalline In—Ga—Zn-oxide semiconductor and its transistor characteristics", Jpn. J. Appl. Phys., vol. 53, 04ED18 (2014).
[Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).
[Non-Patent Document 3] S. Yamazaki et al., "SID Symposium Digest of Technical Papers", 2012, volume 43, issue 1, pp. 183-186

SUMMARY OF THE INVENTION

Problems to be Solved by the Invention

A NAND flash memory in which a plurality of memory cell layers are stacked (in this specification and the like, also referred to as a NAND flash memory having a three-dimensional structure or a 3D NAND) has been pursued an increase in storage capacity by increasing the number of memory cell layers to be stacked. A NAND flash memory having 96 memory cell layers to be stacked has been in practical use and in recent years, a NAND flash memory having 100 layers or more has been developed.

However, in a NAND flash memory having a three-dimensional structure, when the number of memory cell layers to be stacked is increased, the number of wirings provided substantially perpendicular to the memory cell layers is increased and a chip area is increased (a decrease in chip area efficiency) in order to transmit data to each memory cell layer, which has been a problem.

An object of one embodiment of the present invention is to provide a NAND flash memory having a three-dimensional structure with a small number of wirings provided substantially perpendicular to memory cell layers. Another object of one embodiment of the present invention is to provide a NAND flash memory having a three-dimensional structure in which an increase in the number of wirings provided substantially perpendicular to memory cell layers is inhibited even when the number of memory cell layers to be stacked is increased. Another object of one embodiment of the present invention is to provide a NAND flash memory having a three-dimensional structure with high chip area efficiency.

Note that one embodiment of the present invention does not necessarily have to achieve all the above-described objects and only needs to achieve at least one of the objects. The descriptions of the above objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a memory device including a first layer, a second layer, and a third layer. A decoder is provided in the first layer, a memory cell portion is provided in the second layer, and a circuit is provided in the third layer. The circuit has a function of controlling the decoder and the memory cell portion, and the decoder has a function of selecting or deselecting part of the memory cell portion. At least part of the second layer is provided to be stacked above the third layer, and at least part of the first layer is provided to be stacked above the second layer.

Another embodiment of the present invention is a memory device including a first layer, a second layer, and a third layer. A decoder is provided in the first layer, a memory cell portion is provided in the second layer, and a circuit is provided in the third layer. The circuit has a function of controlling the decoder and the memory cell portion, and the circuit has a function of outputting a selection signal to the decoder. The memory cell portion includes a NAND memory element having a three-dimensional structure, and the decoder has a function of outputting a signal for selecting or deselecting part of the memory cell portion to the memory cell portion in accordance with the selection signal. At least part of the second layer is provided to be stacked above the third layer, and at least part of the first layer is provided to be stacked above the second layer.

In the above embodiment, the third layer includes a single crystal silicon substrate, and the circuit includes a first transistor formed using the single crystal silicon substrate. The decoder includes a second transistor, and the second transistor contains a metal oxide in a channel formation region.

In the above embodiment, the third layer includes an SOI substrate, and the circuit includes a first transistor formed using the SOI substrate. The decoder includes a second transistor, and the second transistor contains a metal oxide in a channel formation region.

Another embodiment of the present invention is an electronic device including the memory device in the above embodiment.

Effect of the Invention

According to one embodiment of the present invention, a NAND flash memory having a three-dimensional structure with a small number of wirings provided substantially perpendicular to memory cell layers can be provided. According to one embodiment of the present invention, a NAND flash memory having a three-dimensional structure in which an increase in the number of wirings provided substantially perpendicular to memory cell layers is inhibited even when the number of memory cell layers to be stacked is increased can be provide. According to one embodiment of the present invention, a NAND flash memory having a three-dimensional structure with high chip area efficiency can be provided.

Note that the description of these effects does not preclude the existence of other effects. One embodiment of the present invention does not necessarily have to have all the effects. Effects other than these are apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 13A is a table showing classifications of crystal structures of IGZO. FIG. 13B is a graph showing an XRD spectrum of a CAAC-IGZO film. FIG. 13C is an image showing nanobeam electron diffraction patterns of a CAAC-IGZO film.

MODE FOR CARRYING OUT THE INVENTION

Figure 1:
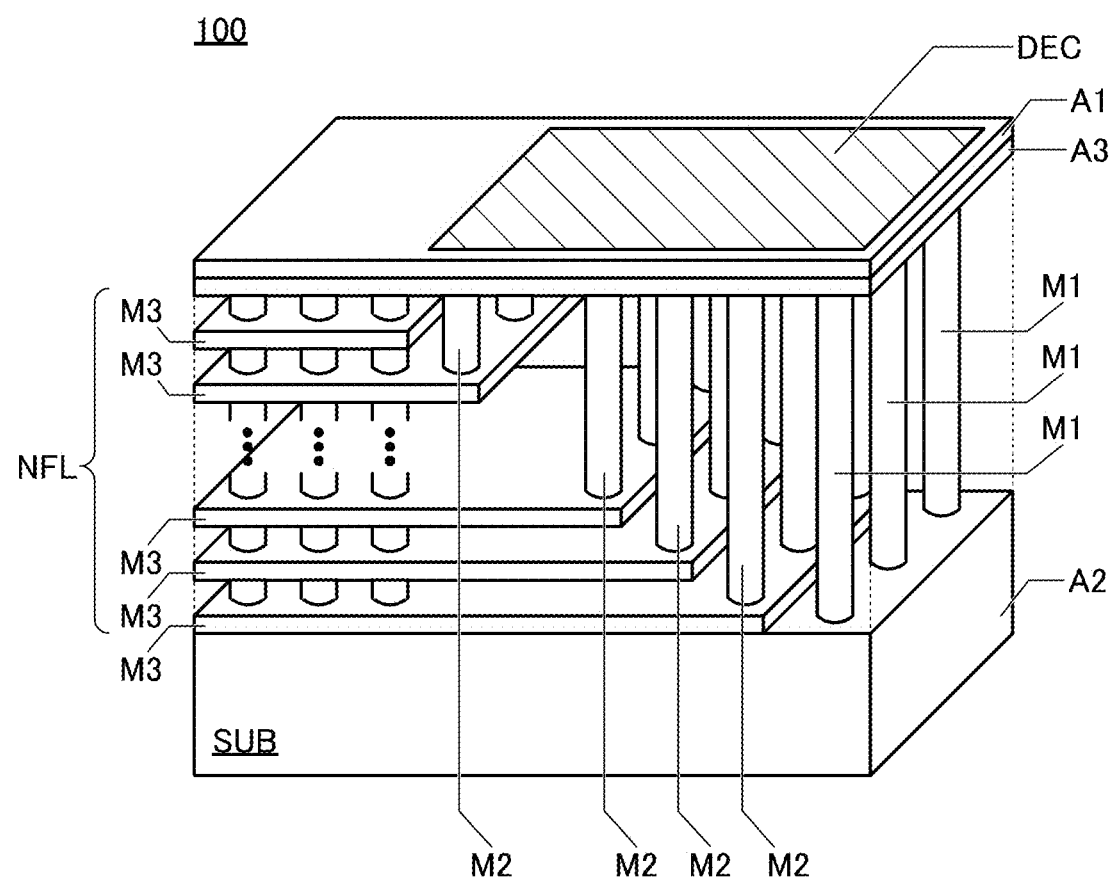
FIG. 1 is a schematic perspective view illustrating a structure example of a memory device.

Embodiments will be described below with reference to the drawings. However, the embodiments can be implemented in many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to completely separate actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference signs, and in particular need to be distinguished from each other, an identification sign such as "_1", "_2", "[n]", or "[m, n]" is sometimes added to the reference signs. For example, a second wiring GL is referred to as a wiring GL[2].

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitive element, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitive element" has a structure in which two electrodes face each other with an insulator (dielectric) therebetween. Furthermore, in this specification and the like, cases where a "capacitive element" is one having a structure in which two electrodes face each other with an insulator therebetween, one having a structure in which two wirings face each other with an insulator therebetween, or one in which two wirings are positioned with an insulator therebetween, are included.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a source, a drain, and a gate. In addition, a channel formation region is included between the source (a source terminal, a source region, or a source electrode) and the drain (a drain terminal, a drain region, or a drain electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or the direction of current flow is changed in circuit operation, for example. Thus, the terms of a source and a drain are interchangeable in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can be referred to as a metal oxide semiconductor. In other words, a transistor including a metal oxide in a channel formation region can be referred to as an "oxide semiconductor transistor" or an "OS transistor". Similarly, a "transistor using an oxide semiconductor" is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a memory device according to one embodiment of the present invention will be described.

<Structure Example of Memory Device>

FIG. 1 is a schematic perspective view illustrating a structure example of a memory device 100 according to one embodiment of the present invention. The memory device 100 includes a circuit layer A1, a circuit layer A2, a wiring layer A3, a NAND flash layer NFL, and conductors M1 to conductors M3.

As illustrated in FIG. 1, the memory device 100 has a structure in which the NAND flash layer NFL is provided to be stacked above the circuit layer A2, the wiring layer A3 is provided above the NAND flash layer NFL, and the circuit layer A1 is provided to be stacked above the wiring layer A3. Note that the wiring layer A3 is included in the circuit layer A1; thus, the description thereof will be omitted unless necessary.

The circuit layer A2 and the circuit layer A1 are electrically connected to each other through the conductors M1, and the circuit layer A1 and the NAND flash layer NFL are electrically connected to each other through the conductors M2 and the conductors M3.

A circuit that can function by utilizing semiconductor characteristics is provided in each of the circuit layer A1, the NAND flash layer NFL, and the circuit layer A2; a decoder DEC is provided in the circuit layer A1, a memory cell portion MCL is provided in the NAND flash layer NFL, and a circuit OSC is provided in the circuit layer A2. For example, the decoder DEC is positioned in a region overlapping with a plurality of conductors M1 electrically connected to the circuit layer A2 and a plurality of conductors M2 electrically connected to the NAND flash layer NFL.

In the memory device 100, the circuit layer A2, the NAND flash layer NFL, and the wiring layer A3 form a memory portion, and the memory portion can be, for example, a NAND flash memory having a three-dimensional structure.

Note that the memory portion is not limited to a NAND flash memory having a three-dimensional structure and may be either a NAND flash memory having a two-dimensional structure or a NOR flash memory. Alternatively, a memory portion using a nonvolatile memory element such as an MRAM (Magnetoresistive RAM), a PRAM (Phase change RAM), an ReRAM (Resistive RAM), or an FeRAM (Ferroelectric RAM) may be used, or the memory portions may be used in combination.

The circuit OSC has a function of controlling the memory cell portion MCL and the decoder DEC. The memory cell portion MCL includes a plurality of memory cells and performs data writing and reading by a write circuit, a read circuit, and the like included in the circuit OSC. When the circuit OSC selects one of a plurality of pages of the NAND flash layer NFL, the circuit OSC outputs a selection signal to the decoder DEC through the plurality of conductors M1 electrically connected to the circuit layer A2. Note that in this structure example, the selection signal output from the circuit layer A2 to the decoder DEC is a digital signal.

The decoder DEC has a function of selecting one page of the NAND flash layer NFL in accordance with the selection signal. For example, the decoder DEC has a function of outputting a high level potential to the selected page of the NAND flash layer NFL through the conductors M2 and the conductors M3, and outputting a low level potential to the non-selected pages of the NAND flash layer NFL through the conductors M2 and the conductors M3. Note that the conductors M1 include another wiring such as a wiring for transmitting a signal other than the above selection signal, or a power supply line for supplying a constant potential.

The circuit OSC is formed with transistors formed on a substrate SUB. For example, a single crystal semiconductor substrate or a polycrystalline semiconductor substrate using silicon, silicon carbide, or the like as a material or a compound semiconductor substrate using silicon germanium or the like as a material can be used as the substrate SUB. Furthermore, an SOI substrate, a semiconductor substrate on which a semiconductor element such as a strained transistor or a FIN-type transistor is provided, a glass substrate such as barium borosilicate glass or aluminoborosilicate glass, a ceramic substrate, a quartz substrate, a sapphire substrate, or the like may be used as the substrate SUB. A flexible substrate may be used as the substrate SUB.

In this embodiment, a case in which a single crystal silicon substrate is used as the substrate SUB will be described. Note that in this specification and the like, a transistor including silicon in a channel formation region is referred to as a Si transistor.

The decoder DEC can be formed using an OS transistor, for example. In the case where the decoder DEC is formed using an OS transistor, the OS transistor can be formed by a method such as a thin film method, whereby the decoder DEC can be provided to be stacked above the circuit OSC and the memory cell portion MCL. Specifically, for example, the circuit OSC and the memory cell portion MCL can be formed using a Si transistor and the decoder DEC can be formed thereabove using an OS transistor. The OS transistor is a transistor containing a metal oxide in a channel formation region.

The decoder DEC can be manufactured by a process different from that of the circuit OSC and the memory cell portion MCL. Since an OS transistor can have a lower formation temperature than a Si transistor, when the decoder DEC is formed using an OS transistor, an influence of heat on Si transistors included in the circuit OSC and the memory cell portion MCL can be reduced. In addition, since the decoder DEC is provided above the circuit OSC and the memory cell portion MCL to overlap with the circuit OSC and the memory cell portion MCL, an increase in a circuit area of the memory device 100 can be suppressed.

In the case where the decoder DEC is not provided in the circuit layer A1 (the memory device 100 does not include the decoder DEC), the number of wirings for transmitting a selection signal from the circuit layer A2 to the NAND flash layer NFL through the circuit layer A1 needs to be equal to the number of pages included in the NAND flash layer NFL. Meanwhile, in the case where the decoder DEC is provided in the circuit layer A1, the selection signal from the circuit layer A2 to the circuit layer A1 is a digital signal. By setting the selection signal from the circuit layer A2 to the circuit layer A1 to a digital signal, the number of wirings from the circuit layer A2 to the circuit layer A1, that is, the number of conductors M1 can be smaller than that in the case where the decoder DEC is not provided in the circuit layer A1.

For example, when the number of pages of the NAND flash layer NFL is set to X (X is an integer satisfying $2^k$, and k is an integer greater than or equal to 1), the number of wirings from the circuit layer A2 to the circuit layer A1 needs to be at least X in the case where the decoder DEC is not provided in the circuit layer A1. By contrast, in the case where the decoder DEC is provided in the circuit layer A1, the number of wirings from the circuit layer A2 to the circuit layer A1 can be "Y+$\log_2 X$" (Y is an integer greater than or equal to 0). Note that Y represents the number of wirings other than a selection signal, such as power supply of the decoder DEC.

Accordingly, providing the decoder DEC in the circuit layer A1 can reduce the number of conductors M1. That is, even when the number of stacked layers of the NAND flash layer NFL is increased and the number of pages included in the NAND flash layer NFL is increased, the number of wirings from the circuit layer A2 to the circuit layer A1 can be reduced by providing the decoder DEC in the circuit layer A1, so that an increase in the chip area can be prevented (the chip area efficiency can be increased).

The number of wirings from the circuit layer A2 to the circuit layer A1 is reduced, whereby the influence of the parasitic resistance can be reduced; for example, an increase in power consumption due to the parasitic resistance can be reduced. Moreover, the number of wirings from the circuit layer A2 to the circuit layer A1 is reduced, whereby the influence of the parasitic capacitance can be reduced; for example, a decrease in the driving frequency of a memory device due to the parasitic capacitance can be prevented.

Next, a structure example of the memory device 100 is described with reference to a block diagram illustrated in FIG. 2. Note that in the drawings described in this specification and the like, the flow of main signals is indicated by an arrow or a line, and a power supply line and the like are omitted in some cases.

<Memory Cell Portion MCL>

The memory cell portion MCL includes a memory cell array MCA. The memory cell array MCA includes a plurality of strings SRG. The strings SRG are electrically connected to wirings BL. Each string SRG includes a plurality of transistors CTr electrically connected in series and a transistor BTr and a transistor STr for selecting. Note that one transistor CTr functions as a cell transistor, which is included in the memory cell MC of the string SRG.

In general, a cell transistor is a transistor that operates with normally-on characteristics and includes a control gate and a charge accumulation layer. The charge accumulation layer is provided in a region overlapping with a channel formation region with a tunnel insulating film therebetween, and the control gate is provided in a region overlapping with the charge accumulation layer with a blocking film therebetween. In the cell transistor, a tunnel current occurs when a write potential is applied to the control gate and a predetermined potential is applied to a first terminal or a second terminal of the cell transistor; hence, electrons are injected from the channel formation region into the charge accumulation layer of the cell transistor. Thus, the threshold voltage of a cell transistor in which electrons are injected into its charge accumulation layer is increased. Note that a floating gate may be used instead of the charge accumulation layer.

Channel formation regions of the transistor BTr, the transistor CTr, and the transistor STr preferably contain any one or more materials selected from, for example, silicon, germanium, gallium arsenide, silicon carbide (SiC), and a metal oxide that will be described in Embodiment 3.

Particularly in the case where the channel formation region contains a metal oxide of any one or more selected from indium, an element M (e.g., aluminum, gallium, yttrium, or tin can be given as the element M), and zinc, the metal oxide sometimes functions as a wide gap semiconductor; thus, the transistor BTr, the transistor CTr, and the transistor STr containing the metal oxide in these channel formation regions have ultralow off-state current characteristics. That is, the leakage current of the transistor BTr, the transistor CTr, and the transistor STr in the off state can be reduced, so that power consumption of the memory device can be reduced in some cases.

Figure 2:
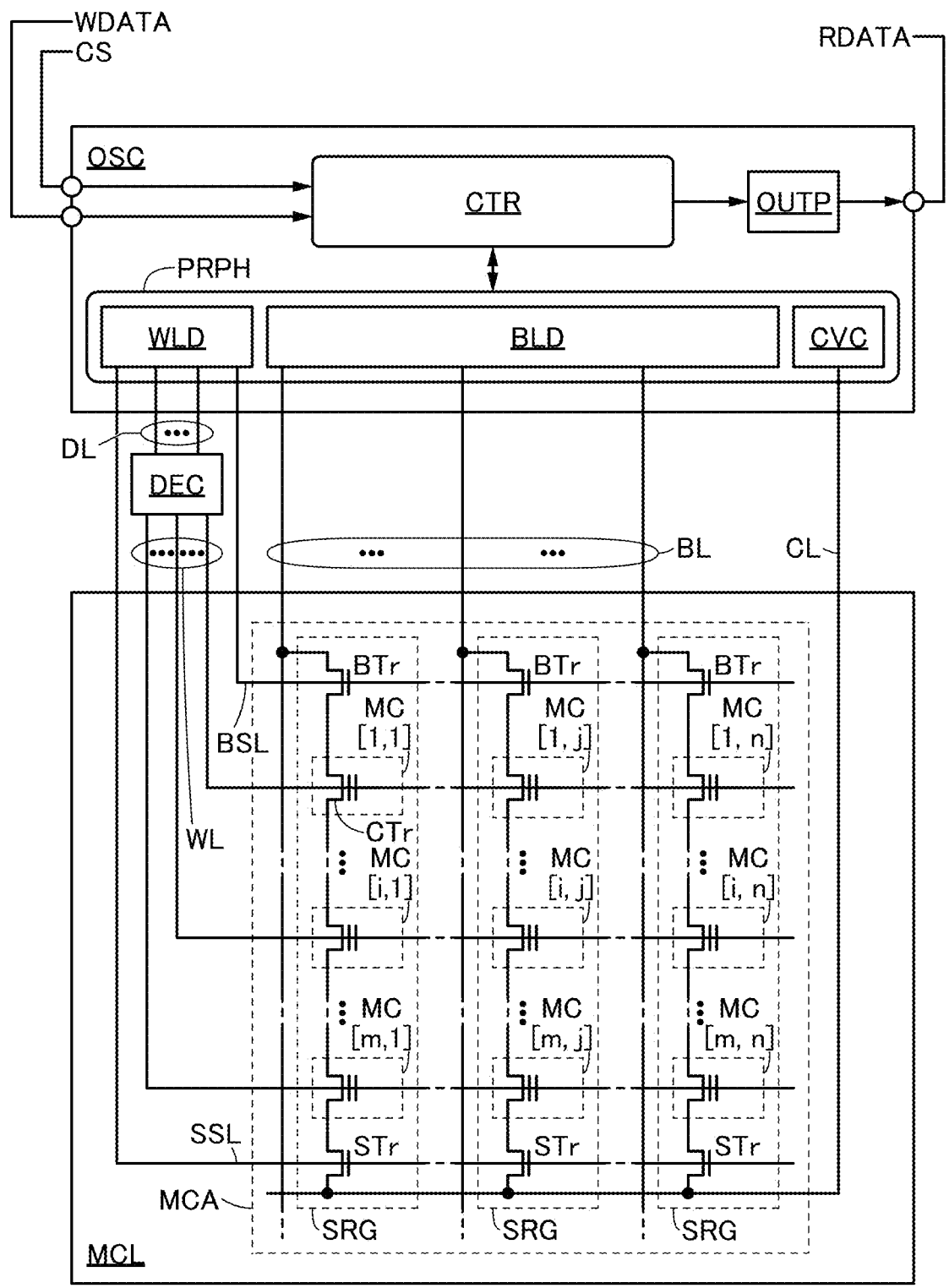
FIG. 2 is a block diagram illustrating a structure example of a memory device.

Note that although FIG. 2 illustrates an example in which the transistors BTr and the transistors STr are formed in the memory cell portion MCL, the transistors BTr and the transistors STr may be formed in the circuit OSC.

The memory cell array MCA includes a plurality of memory cells MC in the string SRG. The plurality of memory cells MC are arranged in a matrix. The memory cell array MCA in FIG. 2 includes m×n memory cells MC in total; m memory cells in one column and n memory cells in one row (m and n are each an integer greater than or equal to 2). The memory cell MC which is positioned at an i-th column and a j-th row (i is an integer greater than or equal to 1 and less than or equal to m, and j is an integer greater than or equal to 1 and less than or equal to n) is represented as MC[i, j] in FIG. 2. Note that FIG. 2 only illustrates a memory cell MC[1, 1], a memory cell MC[i, 1], a memory cell MC[m, 1], a memory cell MC[1, j], the memory cell MC[i, j], a memory cell MC[m, j], a memory cell MC[1, n], a memory cell MC[i, n], and a memory cell MC[m, n], and other memory cells MC are not illustrated.

Wirings DL, wirings WL, wirings BL, a wiring CL, a wiring BSL, and a wiring SSL illustrated in FIG. 2 correspond to the conductors M1 to the conductors M3 illustrated in FIG. 1. For example, the wirings DL are wirings for outputting a selection signal from the circuit OSC to the decoder DEC and correspond to the conductors M1, and the wirings WL are a plurality of word lines and correspond to the conductors M2 and the conductors M3. Each of the wirings WL is electrically connected to the memory cell MC in every row. The wirings BL are a plurality of bit lines, and each of the wirings BL is electrically connected to the memory cell MC in every column. The wiring CL is a power supply line. The wirings BL and the wiring CL are electrically connected to the memory cell array MCA through the conductors M1 and the wiring layer A3, for example.

Next, a connection structure of the strings SRG electrically connected to the wirings BL is described. One of a source and a drain of the transistor BTr is electrically connected to the wiring BL, and one of a source and a drain of the transistor STr is electrically connected to the wiring CL. One end of the plurality of transistors CTr electrically connected in series is electrically connected to the other of the source and the drain of the transistor BTr, and the other end of the plurality of transistors CTr electrically connected in series is electrically connected to the other of the source and the drain of the transistor STr.

The wiring BSL and the wiring SSL function as wirings for selecting a string on which writing, reading, or erasing is performed. The wiring BSL is electrically connected to the gates of the transistors BTr included in the memory cell portion MCL, and the wiring SSL is electrically connected to the gates of the transistors STr included in the memory cell portion MCL.

Figure 3:
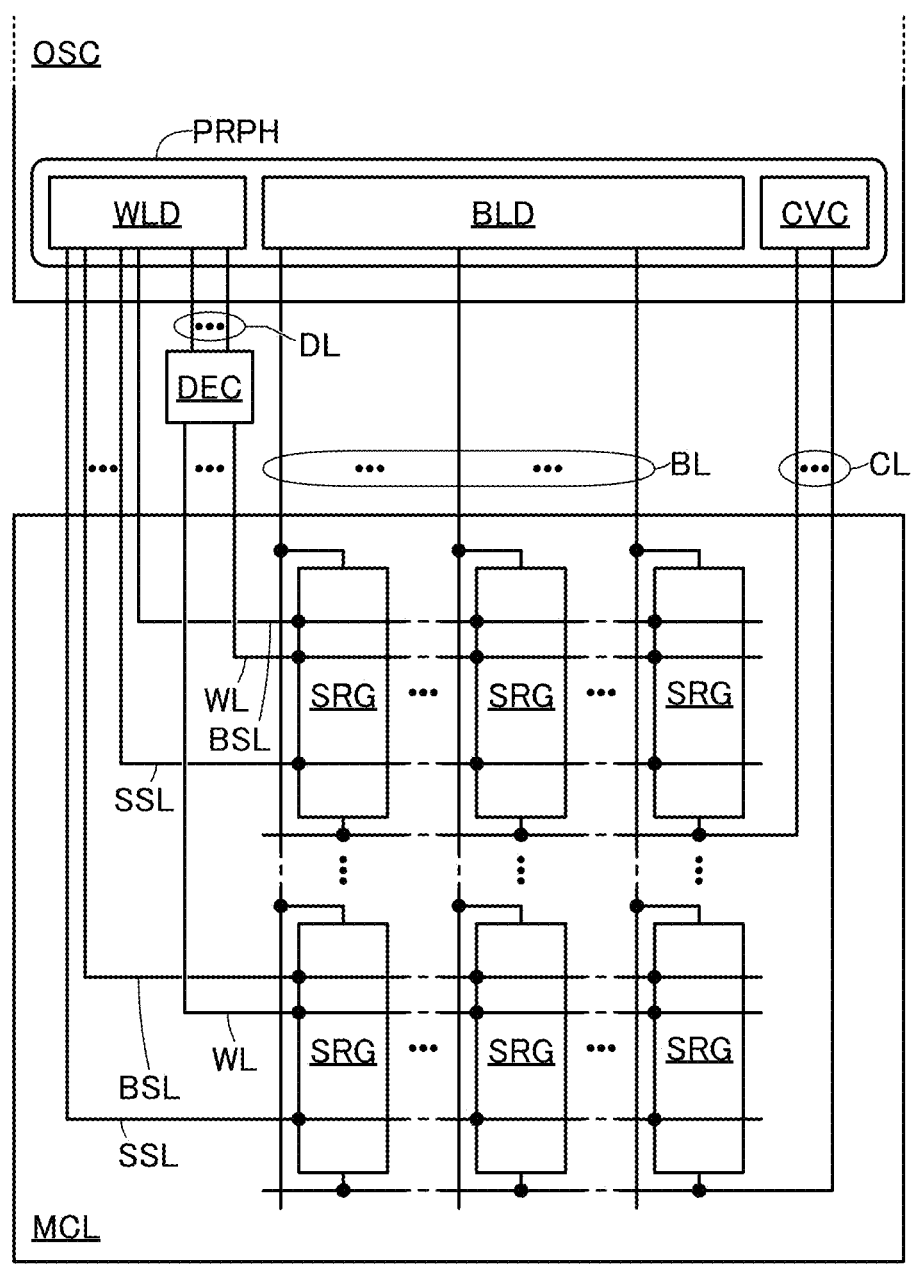
FIG. 3 is a block diagram illustrating a structure example of part of a memory device.

In FIG. 2, in the memory cell portion MCL, one wiring BL is electrically connected to one string SRG; however, one embodiment of the present invention is not limited thereto. For example, as illustrated in FIG. 3, one wiring BL may be electrically connected to a plurality of strings SRG in the memory cell portion MCL. Note that in a block diagram in FIG. 3, the memory cell portion MCL and part of the circuit OSC are illustrated.

<Circuit OSC>

The circuit OSC includes a control circuit CTR, a circuit PRPH, and an output circuit OUTP. From the outside of the memory device 100, control signals CS (e.g., a clock signal, a chip enable signal, a write enable signal, and an address signal) and a data signal WDATA are input to the control circuit CTR, for example.

The control circuit CTR has a function of writing data to the memory cell portion MCL by access to the circuit PRPH and a function of reading data from the memory cell portion MCL.

That is, when a writing instruction in accordance with the control signal CS and the data signal WDATA are input from the outside of the memory device 100, the control circuit CTR writes the data signal WDATA to the memory cell portion MCL. In addition, when a reading instruction in accordance with the control signal CS is input from the outside of the memory device 100, the control circuit CTR reads data from the memory cell portion MCL and outputs the data to the output circuit OUTP. The output circuit OUTP is output as a data signal RDATA to the outside of the memory device 100. Note that the writing instruction and the reading instruction each include an address signal.

The control circuit CTR may have a function of detecting and correcting errors (also referred to as ECC: Error Check and Correct) when data is read out from the memory cell portion MCL. Note that a signal processed by the control circuit CTR and the functions of the control circuit CTR are not limited thereto, and other signals may be input (or output) as necessary or the control circuit CTR may have other functions.

The circuit PRPH includes, for example, a circuit WLD, a circuit BLD, and a circuit CVC. The circuit WLD functions as a word line driver circuit. Note that in this embodiment, the circuit WLD is electrically connected to the wirings DL and outputs a selection signal to the decoder DEC. The circuit BLD functions as a bit line driver circuit and is electrically connected to the wirings BL. The circuit CVC generates a constant potential, functions as a power source that outputs the constant potential, and is electrically connected to the wiring CL. The circuit CVC is not necessarily included in the circuit PRPH and may be provided outside the memory device 100, for example. In this case, the memory cell portion MCL of the memory device 100 is supplied with a constant potential from the outside.

<Decoder DEC>

Next, the decoder DEC included in the circuit layer A1 is described.

The circuit layer A1 is provided to be stacked above the NAND flash layer NFL and thus can be manufactured through a process different from that of the circuit layer A2 and the NAND flash layer NFL. A circuit included in the circuit layer A1 can be manufactured through the same process. For example, a process for forming an OS transistor can be used as the same process.

Note that as for the metal oxide contained in the channel formation region of the OS transistor, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability. Thus, in the case where the circuit in the circuit layer A1 is formed using an OS transistor, the circuit is preferably a single-polarity circuit.

Figure 4:
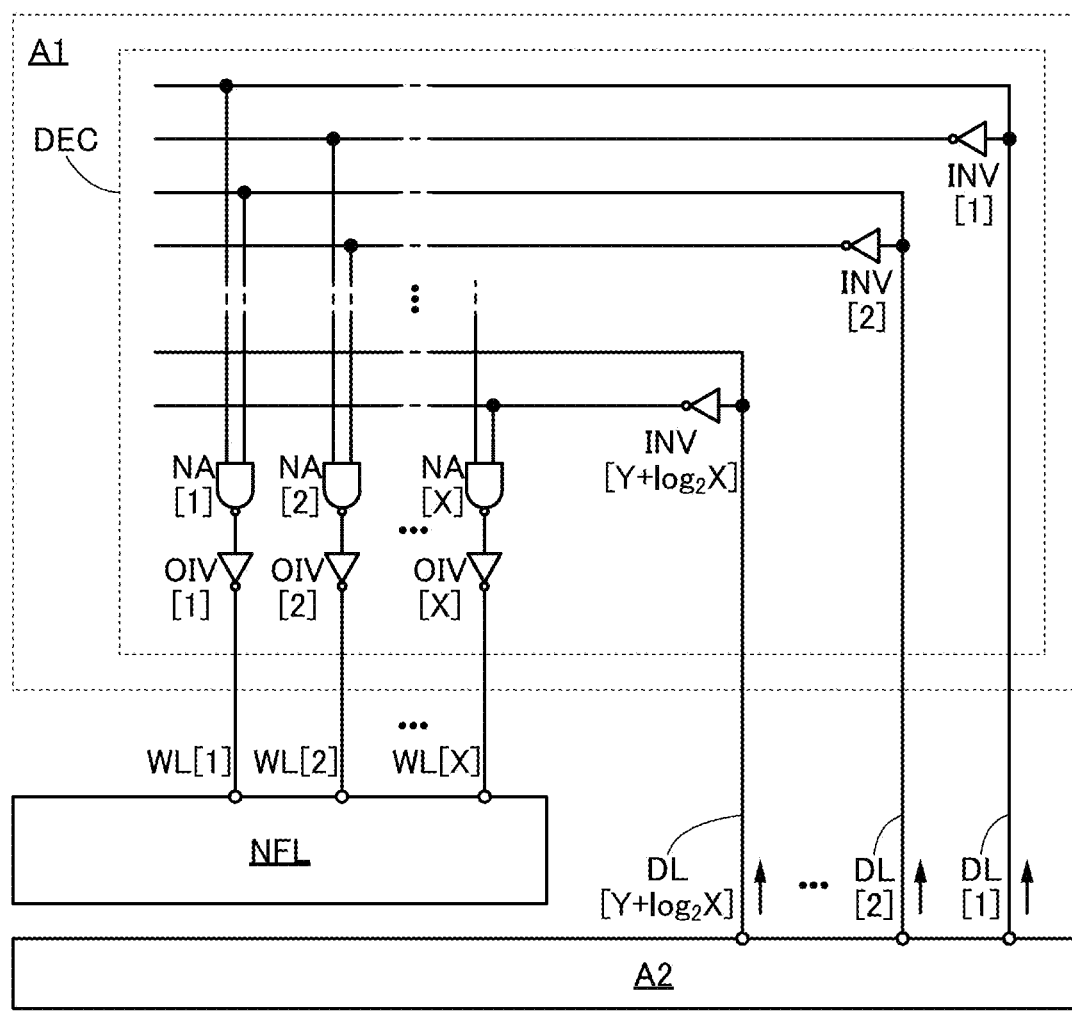
FIG. 4 is a block diagram illustrating a configuration example of a circuit included in a memory device.

FIG. 4 illustrates a configuration example of a circuit of the decoder DEC included in the circuit layer A1 illustrated in FIG. 1. Note that to show electrical connection to the decoder DEC, the circuit layer A2 is also illustrated.

The decoder DEC illustrated in FIG. 4 has functions of receiving a selection signal transmitted from the circuit layer A2 through the wirings DL and selecting one page of the NAND flash layer NFL in accordance with the selection signal. Moreover, the decoder DEC has functions of, for example, outputting a high level potential to the selected page of the NAND flash layer NFL through the wirings WL and outputting a low level potential to the non-selected pages of the NAND flash layer NFL through the wirings WL.

The wirings DL correspond to the wirings included in the conductors M1 in FIG. 1, for example. The wirings WL correspond to the wirings included in the conductors M2 and the conductors M3 in FIG. 1.

Here, the number of pages of the NAND flash layer NFL is X, for example. Thus, the number of wirings WL is X. A digital signal transmitted from the circuit layer A2 is "Y+$\log_2$X" bits, for example. Accordingly, the number of wirings DL is "Y+$\log_2$X".

Accordingly, here, the circuit layer A2 has a function of generating a "Y+$\log_2$X"-bit signal representing the address of one page included in the NAND flash layer NFL.

The decoder DEC includes an inverter circuit INV[1] to an inverter circuit INV[Y+$\log_2$X], an inverter circuit OIV[1] to an inverter circuit OIV[X], and a NAND circuit NA[1] to a NAND circuit NAM, for example.

The wiring DL[t] (t is an integer greater than or equal to 1 and less than or equal to Y+$\log_2$X) is electrically connected to an input terminal of the inverter circuit INV[t]. The wiring DL[t] is electrically connected to one or more selected from first input terminals of the NAND circuit NA[1] to the NAND circuit NAM. An output terminal of the inverter circuit INV[t] is electrically connected to one or more selected from second input terminals of the NAND circuit NA[1] to the NAND circuit NAM.

Note that a circuit configuration of the decoder DEC differs depending on the values of X and Y. Thus, in the above description of the decoder DEC, the detailed description of electrical connection of the circuit included in the decoder DEC is omitted. Moreover, a detailed circuit configuration of the decoder DEC is not illustrated in FIG. 4.

An output terminal of the NAND circuit NA[s] (s is an integer greater than or equal to 1 and less than or equal to X) is electrically connected to an input terminal of the inverter circuit OIV[1] to the inverter circuit OIV[X], and an output terminal of the inverter circuit OIV[1] to the inverter circuit OIV[X] is electrically connected to a wiring WL[s].

Note that the wiring DL[t], the inverter circuit INV[t], the NAND circuit NA[s], the inverter circuit OIV[s], the wiring WL[s] are not illustrated in FIG. 4.

<Single-Polarity Circuit>

Next, configuration examples of the inverter circuit INV[1] to the inverter circuit INV[Y+$\log_2$X], the inverter circuit OIV[1] to the inverter circuit OIV[X], and the NAND circuit NA[1] to the NAND circuit NAM included in the decoder DEC are described.

As described above, since the decoder DEC is included in the circuit layer A1, it is preferable that the inverter circuit INV[1] to the inverter circuit INV[Y+$\log_2$X], the inverter circuit OIV[1] to the inverter circuit OIV[X], and the NAND circuit NA[1] to the NAND circuit NAM included in the decoder DEC be single-polarity circuits using OS transistors.

Figure 5A:
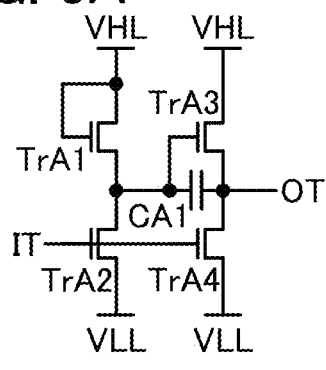
FIG. 5A to FIG. 5C are circuit diagrams each illustrating a configuration example of a circuit included in a memory device.

FIG. 5A illustrates a single-polarity circuit that is a configuration example of an inverter circuit applicable to the inverter circuit INV[1] to the inverter circuit INV[Y+$\log_2$X], the inverter circuit OIV[1] to the inverter circuit OIV[X], or the like.

A terminal IT illustrated in FIG. 5A corresponds to an input terminal of the inverter circuit, and a terminal OT corresponds to an output terminal of the inverter circuit.

The inverter circuit includes, for example, a transistor TrA1 to a transistor TrA4 and a capacitor CA1.

Note that in this specification and the like, the transistor TrA1 to the transistor TrA4 are preferably transistors that can be manufactured through a process similar to those of other circuits included in the circuit layer A1. A material contained in a channel formation region of each of the transistor TrA1 to the transistor TrA4 is preferably the same as a material contained in a channel formation region of each of other transistors included in the circuit layer A1. For example, each of the transistor TrA1 to the transistor TrA4 is preferably an OS transistor.

A first terminal of the transistor TrA1 is electrically connected to a gate of the transistor TrA1 and a wiring VHL; a second terminal of the transistor TrA1 is electrically connected to a first terminal of the transistor TrA2, a gate of the transistor TrA3, and a first terminal of the capacitor CA1; and a second terminal of the transistor TrA2 is electrically connected to a wiring VLL. The terminal IT is electrically connected to a gate of the transistor TrA2 and a gate of the transistor TrA4. A first terminal of the transistor TrA3 is electrically connected to the wiring VHL, and a second terminal of the transistor TrA3 is electrically connected to a first terminal of the transistor TrA4, a second terminal of the capacitor CAL and the terminal OT. A second terminal of the transistor TrA4 is electrically connected to the wiring VLL.

Each of the wiring VHL and the wiring VLL functions as a wiring for applying a constant potential. It is particularly preferable that a potential applied by the wiring VHL be a high-level potential (hereinafter referred to as VDD), and a potential applied by the wiring VLL be a low-level potential (hereinafter referred to as VSS).

Next, operation of the inverter circuit is described. For example, the transistor TrA2 and the transistor TrA4 are brought into an off state when VSS is input to the terminal IT. Since the transistor TrA1 is diode-connected, the potential of the first terminal of the capacitor CA1 (the gate of the transistor TrA3) is increased. When the threshold voltage of the transistor TrA1 is $V_{thA1}$ and the potential of the first terminal of the capacitor CA1 (the gate of the transistor TrA3) reaches VDD−$V_{thA1}$, the transistor TrA1 is brought into an off state. That is, the first terminal of the capacitor CA1 (the gate of the transistor TrA3) is brought into an electrically floating state. At this time, the voltage of the gate with respect to a source of the transistor TrA3 is higher than the threshold voltage of the transistor TrA3, and the transistor TrA3 is brought into an on state. Here, in the case where the terminal OT is not connected to the wiring for applying a constant potential or the like, the potential of the terminal OT becomes higher by a current flowing through the wiring VHL. Since the first terminal of the capacitor CA1 (the gate of the transistor TrA3) is in an electrically floating state, when the potential of the terminal OT becomes higher, the potential of the first terminal of the capacitor CA1 (the gate of the transistor TrA3) also becomes higher by capacitive coupling by the capacitor CA1. Thus, the transistor TrA3 can be kept in an on state, and the potential of the terminal OT finally becomes VDD.

For example, when VDD is input to the terminal IT, the transistor TrA2 and the transistor TrA4 are brought into an on state. In this case, the potential of the first terminal of the capacitor CA1 (the gate of the transistor TrA3) becomes a potential higher than or equal to VSS and lower than or equal to VDD. At this time, the voltage of the gate with respect to the source of the transistor TrA3 is lower than the threshold voltage of the transistor TrA3, and the transistor TrA3 is brought into an off state. Since the transistor TrA4 is in an on state, a current flows from the terminal OT to the wiring VLL, and the potential of the terminal OT finally becomes VSS.

In the inverter circuit in FIG. 5A, as described above, when the first terminal of the capacitor CA1 (the gate of the transistor TrA3) is in an electrically floating state, the voltage of the gate with respect to the source of the transistor TrA3 can be retained by the capacitor CA1 electrically connected between the second terminal and the gate of the transistor TrA3. Thus, when a potential VSS is input to the terminal IT, the potential of the terminal OT can be increased to VDD.

Figure 5B:
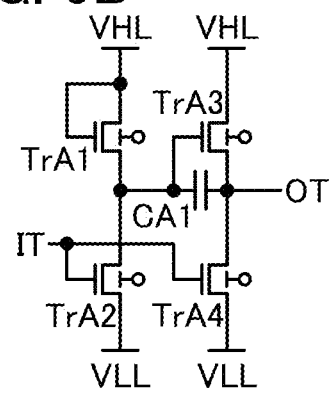

Note that the configuration of the inverter circuit illustrated in FIG. 5A can be changed into that of the inverter circuit illustrated in FIG. 5B. The inverter circuit in FIG. 5B has a configuration in which the transistor TrA1 to the transistor TrA4 are provided with back gates in the inverter circuit illustrated in FIG. 5A. Although the inverter circuit in FIG. 5B has a configuration in which all of the transistor TrA1 to the transistor TrA4 have back gates, a configuration in which one or more transistors selected from the transistor TrA1 to the transistor TrA4 illustrated in FIG. 5A have back gates may be used. Although the connection structure of the back gates is not illustrated in FIG. 5B, portions to which the back gates are electrically connected can be determined at the design stage. For example, in a transistor including a back gate, a gate and the back gate may be electrically connected to each other to increase the on-state current of the transistor. Alternatively, for example, in a transistor including a back gate, a wiring electrically connected to an external circuit or the like may be provided and a potential may be applied to the back gate of the transistor by the external circuit or the like to change the threshold voltage of the transistor. Note that in addition to the transistor of FIG. 5B, a transistor described in another part of this specification or a transistor illustrated in another drawing can have such a back gate.

Figure 5C:
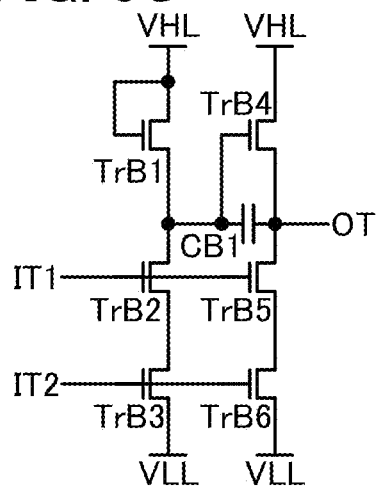

FIG. 5C is a single-polarity circuit that is a configuration example of a NAND circuit applicable to the NAND circuit NA[1] to the NAND circuit NAM.

In FIG. 5C, a terminal IT1 and a terminal IT2 correspond to input terminals of the NAND circuit, and the terminal OT corresponds to an output terminal of the NAND circuit.

The NAND circuit includes a transistor TrB1 to a transistor TrB6 and a capacitor CB1.

Note that in this specification and the like, the transistor TrB1 to the transistor TrB6 are preferably transistors that can be manufactured through a process similar to those of other circuits included in the circuit layer A1, like the transistor TrA1 to the transistor TrA4. A material contained in a channel formation region of each of the transistor TrB1 to the transistor TrB6 is preferably the same as a material contained in a channel formation region of each of other transistors included in the circuit layer A1. For example, each of the transistor TrB1 to the transistor TrB6 is preferably an OS transistor.

A first terminal of the transistor TrB1 is electrically connected to a gate of the transistor TrB1 and the wiring VHL; a second terminal of the transistor TrB1 is electrically connected to a first terminal of the transistor TrB2, a gate of the transistor TrB4, and a first terminal of the capacitor CB1; a second terminal of the transistor TrB2 is electrically connected to a first terminal of the transistor TrB3; and a second terminal of the transistor TrB3 is electrically connected to the wiring VLL. The terminal IT1 is electrically connected to a gate of the transistor TrB2 and a gate of the transistor TrB5, and the terminal IT2 is electrically connected to a gate of the transistor TrB3 and a gate of the transistor TrB6. A first terminal of the transistor TrB4 is electrically connected to the wiring VHL, and a second terminal of the transistor TrB4 is electrically connected to a second terminal of the capacitor CB1, a first terminal of the transistor TrB5, and the terminal OT. A second terminal of the transistor TrB5 is electrically connected to a first terminal of the transistor TrB6, and a second terminal of the transistor TrB6 is electrically connected to the wiring VLL.

For each of the wiring VHL and the wiring VLL, the description of each of the wiring VHL and the wiring VLL in FIG. 5A is referred to.

Next, an operation example of the NAND circuit in FIG. 5C is described. In the NAND circuit, for example, when a potential VSS is input to at least one of the terminal IT1 and the terminal IT2, at least one of the transistor TrB5 and the transistor TrB6 is brought into an off state, whereby a non-conduction state is established between the wiring VLL and the terminal OT. Like the operation example of the inverter circuit in FIG. 5A, in the NAND circuit, when the first terminal of the capacitor CB1 (the gate of the transistor TrB4) is in an electrically floating state, the voltage of the gate with respect to the source of the transistor TrB4 can be retained by the capacitor CB1 electrically connected between the second terminal and the gate of the transistor TrB4. Thus, when a potential VSS is input to the terminal IT1 and/or the terminal IT2, the potential of the terminal OT can be increased to VDD.

For example, in the NAND circuit, when a VDD potential is input to each of the terminal IT1 and the terminal IT2, the transistor TrB5 and the transistor TrB6 are brought into an on state, whereby a conduction state is established between the wiring VLL and the terminal OT. The potential of the first terminal of the capacitor CB1 (the gate of the transistor TrB4) becomes a potential higher than or equal to VSS and lower than or equal to VDD. At this time, the voltage of the gate with respect to the source of the transistor TrB4 is lower than the threshold voltage of the transistor TrB4, and the transistor TrB4 is brought into an off state. Thus, when a VDD potential is input to the terminal IT1 and the terminal IT2, the potential of the terminal OT becomes VSS.

Note that this embodiment can be implemented in appropriate combination with the other embodiments described in this specification.

Embodiment 2

Figure 6:
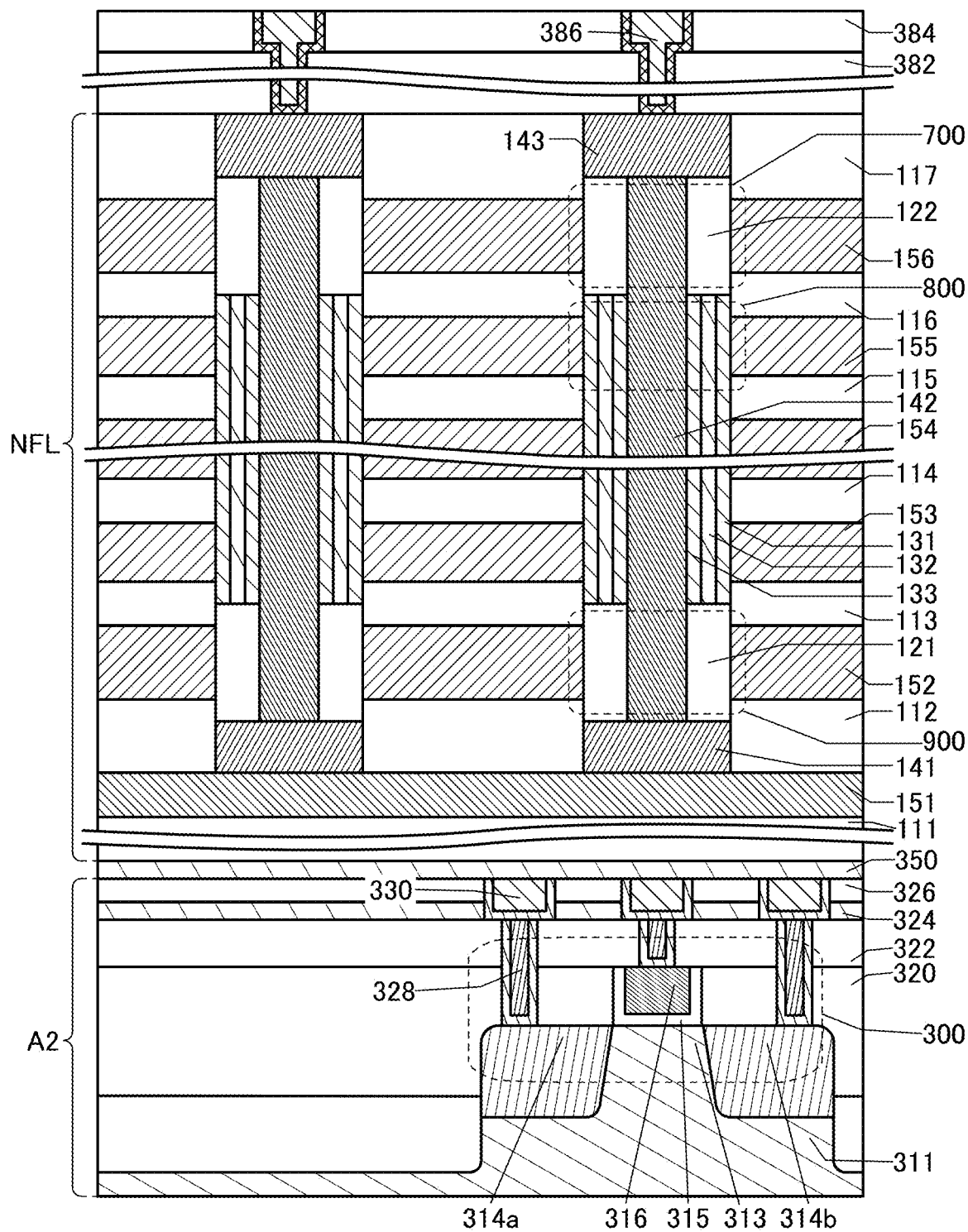
FIG. 6 is a cross-sectional view illustrating a structure example of a memory device.
Figure 7:
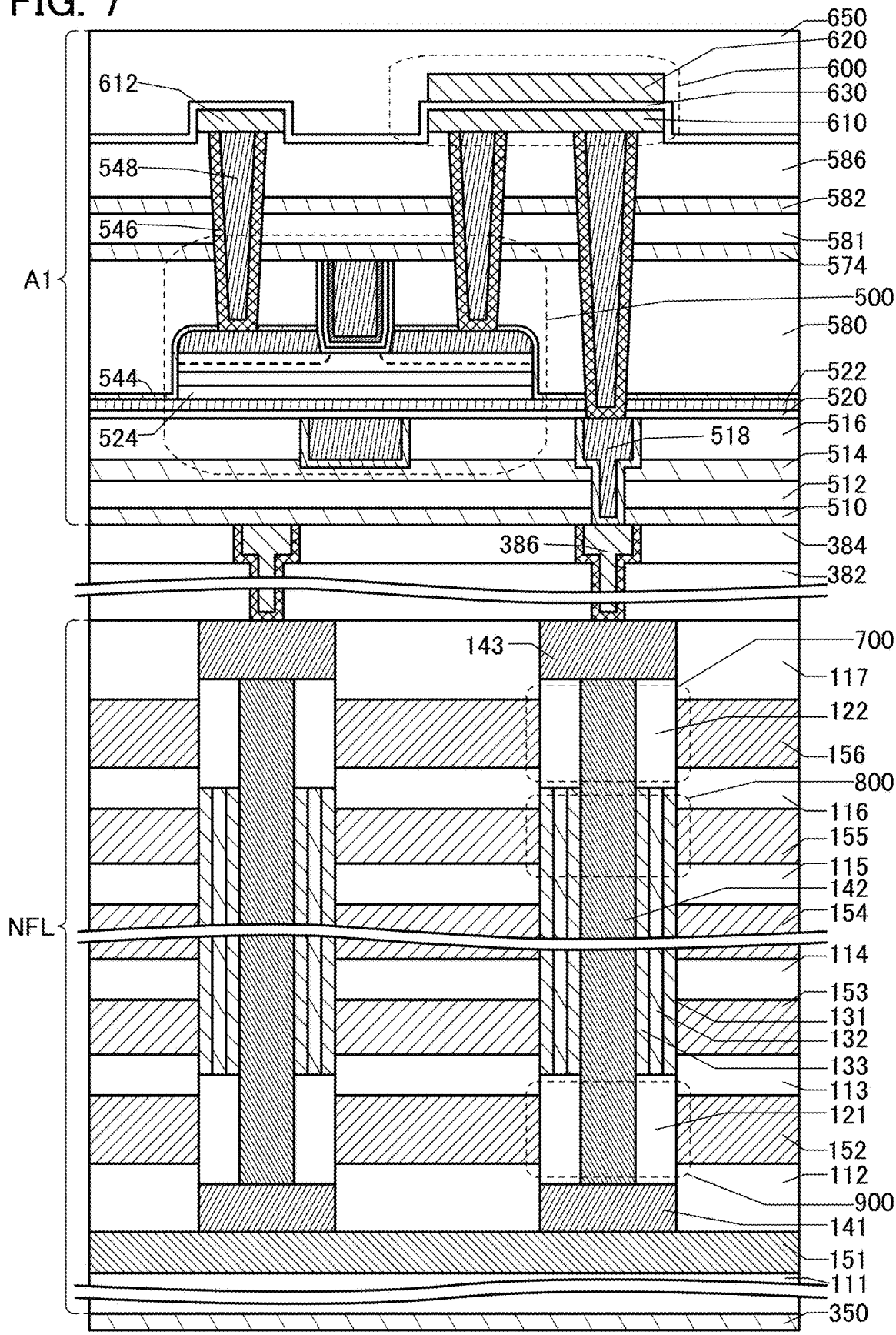
FIG. 7 is a cross-sectional view illustrating a structure example of a memory device.

In this embodiment, structure examples of the transistor included in the memory device 100 described in the above embodiment will be described. FIG. 6 illustrates a cross-sectional structure example of the circuit layer A2 and the NAND flash layer NFL, and FIG. 7 illustrates a cross-sectional structure example of the NAND flash layer NFL and the circuit layer A1. Note that in this embodiment, the case is described in which a single crystal silicon substrate is used as the substrate SUB, a NAND memory element having a three-dimensional structure is included in the NAND flash layer NFL, and an OS transistor is formed in the circuit layer A1.

In FIG. 6 and FIG. 7, a transistor 300 is formed in the circuit layer A2, a transistor 700, a plurality of transistors 800, and a transistor 900 are formed in the NAND flash layer NFL, and a transistor 500 is formed in the circuit layer A1.

Note that the transistor 700 corresponds to the transistor BTr in FIG. 2, the transistor 800 corresponds to the transistor CTr in FIG. 2, and the transistor 900 corresponds to the transistor STr in FIG. 2. The transistor 300 is one of the transistors included in the circuit OSC, the transistor 500 is one of the transistors included in the decoder DEC, and a capacitor 600 corresponds to, for example, the capacitor CA1.

The transistor 500 includes a second gate (also referred to as a bottom gate or a back gate) in addition to a first gate (also referred to as a top gate or a front gate, or simply a gate). The transistor 500 is a transistor containing a metal oxide in a channel formation region (an OS transistor). Since the transistor 500 can be formed by a method such as a thin film method, in the above embodiment, the decoder DEC is formed using the transistor 500 and thus can be provided to be stacked above the circuit OSC and the memory cell portion MCL.

Figure 8A:
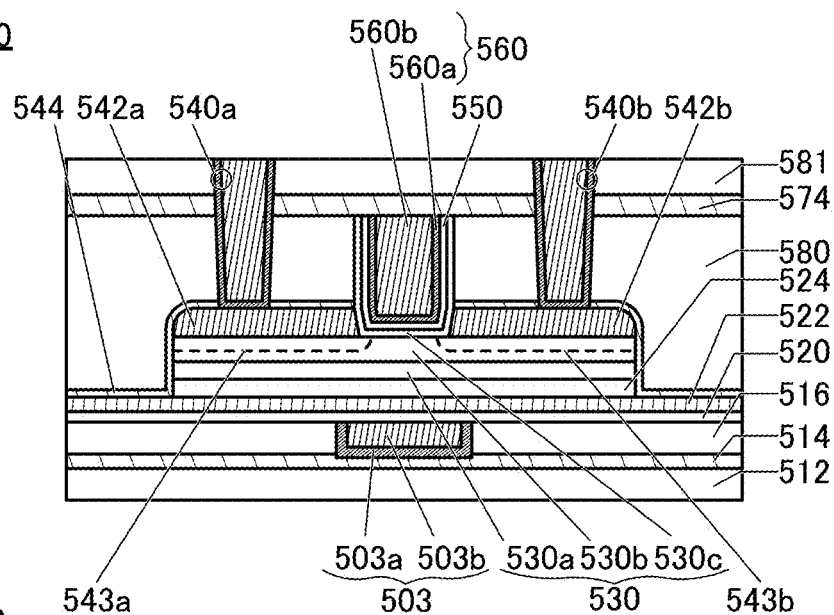
FIG. 8A to FIG. 8C are cross-sectional views illustrating a structure example of a transistor.
Figure 8B:
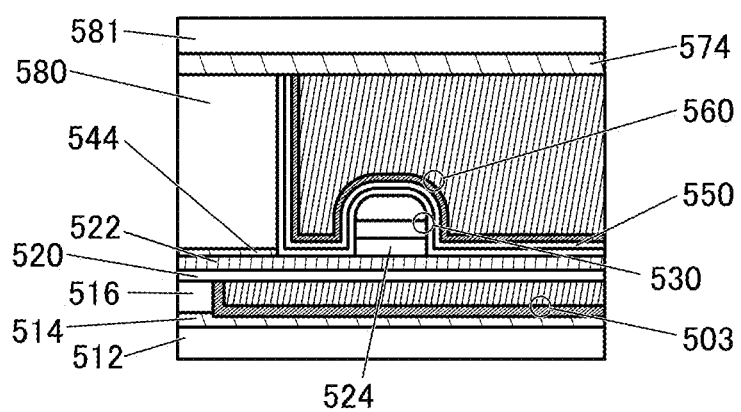
Figure 8C:
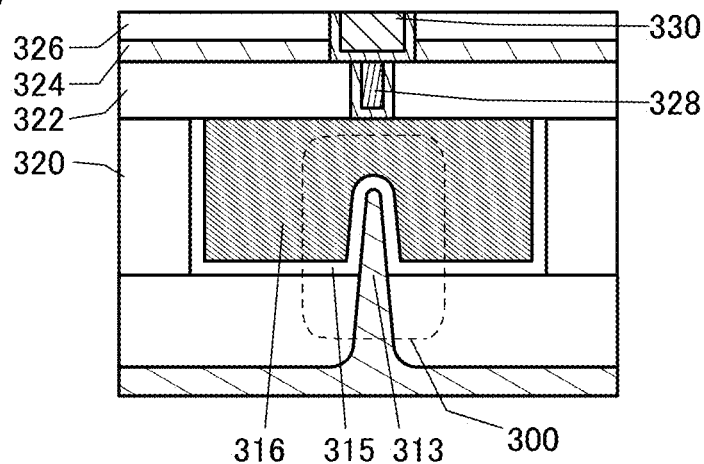

FIG. 8A is a cross-sectional view of the transistor 500 in the channel length direction, FIG. 8B is a cross-sectional view of the transistor 500 in the channel width direction, and FIG. 8C is a cross-sectional view of the transistor 300 in the channel width direction. As illustrated in FIG. 6 and FIG. 7, in the memory device 100 described in this embodiment, the NAND flash layer NFL is provided above the circuit layer A2, and the circuit layer A1 is provided above the circuit layer A2 and the NAND flash layer NFL.

<Structure Example of Circuit Layer A2>

The transistor 300 is provided on a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 8C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, the regions may be formed using a material containing Ge (germanium), SiGe (silicon germanium), GaAs (gallium arsenide), GaN (gallium nitride), GaAlAs (gallium aluminum arsenide), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 6 is an example and is not limited to the structure illustrated therein; an appropriate transistor may be used in accordance with a circuit structure or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low relative permittivity is used for an interlayer film, the parasitic capacitance generated between wirings can be reduced.

A conductor 328, a conductor 330, and the like are embedded in the insulator 320, the insulator 322, the insulator 324, and the insulator 326. Note that the conductor 328 and the conductor 330 each have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

Although not illustrated in FIG. 6, a wiring layer may be provided over the insulator 326 and the conductor 330. For example, it is preferable that an insulator having a barrier property against hydrogen like the insulator 324 be provided over the insulator 326 and the conductor 330 and a conductor having a barrier property against hydrogen be provided in the insulator. When the conductor having a barrier property against hydrogen is formed in an opening portion of the insulator having a barrier property against hydrogen, the transistor 300 and the transistor 500 can be separated from each other by the barrier layer, and hydrogen diffusion into the transistor 500 from the transistor 300 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator having a barrier property against hydrogen. Note that in FIG. 6, an insulator 350 having a barrier property against hydrogen is provided over the insulator 326 and the conductor 330.

<Structure Example of NAND Flash Layer NFL>

The NAND flash layer NFL illustrated in FIG. 6 is provided above the circuit layer A2. The NAND flash layer NFL includes an insulator 111 to an insulator 117, an insulator 121, an insulator 122, an insulator 131, an insulator 132, an insulator 133, a conductor 151 to a conductor 156, and a semiconductor 141 to a semiconductor 143 above the circuit layer A2.

In the case where the insulator 111 is provide over the circuit layer A2 and the insulator 111 has a function of a base film, the insulator 111 is preferably formed by a deposition method with good planarity, for example.

For the insulator 111, a material containing silicon oxide or silicon oxynitride can be used, for example. For example, a single layer or a stacked layer of an insulator including one or more materials selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used.

The conductor 151 is stacked over the insulator 111. The conductor 151 sometimes functions as the wiring CL in FIG. 2.

For the conductor 151, it is possible to use a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. Alternatively, a semiconductor having high electrical conductivity, typified by polycrystalline silicon containing an impurity element such as phosphorus, or silicide such as nickel silicide may be used. A conductive material containing oxygen and a metal element contained in the metal oxide described in Embodiment 3 may be used. A conductive material containing a metal element such as titanium or tantalum and nitrogen can be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used, for example. Furthermore, indium gallium zinc oxide containing nitrogen may be used, for example. Using such a material sometimes allows capture of hydrogen or water entering from a surrounding insulator or the like.

There is no particular limitation on a formation method of the conductor 151. The conductor 151 can be formed by a sputtering method, a CVD method (including a thermal CVD method, an MOCVD method, a PECVD method, or the like), a molecular beam epitaxy (MBE) method, an atomic layer deposition (ALD) method, or a pulsed laser deposition (PLD) method, for example.

The insulator 112, the conductor 152, the insulator 113, the conductor 153, and the insulator 114 are stacked in this order over the conductor 151. The conductor 154, the insulator 115, the conductor 155, the insulator 116, the conductor 156, and the insulator 117 are provided above the insulator 114.

The insulator 112 to the insulator 117 can be formed using, for example, a material similar to that of the insulator 111. The insulator 112 to the insulator 117 are preferably formed using a material with a low permittivity, for example. When a material with a low permittivity is used for the insulator 112 to the insulator 117, the capacitance value of the parasitic capacitance generated by the conductor 152 to the conductor 156 and by the insulator 112 to the insulator 117 can be reduced. This increases the driving speed of the memory cell portion MCL.

There is no particular limitation on a method of forming the insulator 112 to the insulator 117. The insulator 112 to the insulator 117 can be deposited by a sputtering method, a CVD method (including a thermal CVD method, an MOCVD method, a PECVD method, or the like), an MBE method, an ALD method, or a PLD method, for example.

The conductor 152 functions as a gate of the transistor 900 (the transistor STr in FIG. 2) and the wiring SSL in FIG. 2. The conductor 153 to the conductor 155 function as gates of the plurality of transistors 800 (the transistors CTr in FIG. 2) and the wirings WL in FIG. 2. The conductor 156 functions as a gate of the transistor 700 (the transistor BTr in FIG. 2) and the wiring BSL in FIG. 2.

The conductor 152 to the conductor 156 can be formed using a material similar to that used as the conductor 151, for example. The conductor 152 to the conductor 156 can be formed in a manner similar to that of the conductor 151.

In addition, an opening portion is provided in the insulator 112 to the insulator 117 and the conductor 152 to the conductor 156. In the opening portion, the insulator 121, the insulator 122, the insulator 131 to the insulator 133, and the semiconductor 141 to the semiconductor 143 are provided.

The semiconductor 141 is provided to be in contact with side surfaces of part of the opening portion and a bottom surface of the opening portion. Specifically, the semiconductor 141 is provided over part of the conductor 151 and provided to cover part of the insulator 112 on the side surfaces of the opening portion.

For the semiconductor 141, for example, silicon in which impurities are diffused is preferably used. As the impurity, an n-type impurity (donor) can be used. As the n-type impurity, phosphorus or arsenic can be used, for example. As the impurity, a p-type impurity (accepter) can be used. As the p-type impurity, boron, aluminum, or gallium can be used, for example. As silicon, single crystal silicon, hydrogenated amorphous silicon, microcrystalline silicon, or polycrystalline silicon can be used, for example. The semiconductor 141 can also be formed using a metal oxide with a high carrier density other than silicon in some cases. Alternatively, Ge or a compound semiconductor such as ZnSe, CdS, GaAs, InP, GaN, SiGe, or the like can be used in some cases.

Note that a material used for a semiconductor 142 and a semiconductor 143 described later is preferably the same as the material for the semiconductor 141, and the carrier density of the semiconductor 142 is preferably lower than those of the semiconductor 141 and the semiconductor 143 in some cases.

For example, when silicon into which a p-type impurity is diffused is used for the semiconductor 141, it is preferable that the semiconductor 141 be formed over the conductor 151 and a p-type impurity such as boron, aluminum, or gallium be added to the semiconductor 141. This forms a p-type region in the semiconductor 141. For example, when silicon into which an n-type impurity is diffused is used, it is preferable that the semiconductor 141 be formed over the conductor 151 and an n-type impurity such as phosphorus or arsenic be added to the semiconductor 141. This forms an n-type region in the semiconductor 141.

When a metal oxide is used for the semiconductor 141, it is preferable that the semiconductor 141 be formed over the conductor 151 and a metal element or the like be added to the semiconductor 141, for example. This can increase carrier density of the semiconductor 141. In particular, when a metal oxide described in Embodiment 3 is used for the semiconductor 141, an n-type region ($n^+$ region) is formed in the semiconductor 141. Instead of adding a metal element or the like, water, hydrogen, or the like is added to the semiconductor 141 and then heat treatment is performed, whereby oxygen vacancies can be generated in the semiconductor 141.

An n-type region is formed in a region where oxygen vacancies are generated in the semiconductor 141; the carrier density of the semiconductor 141 is increased as a result.

The insulator 121 is provided to be in contact with the side surfaces of part of the opening portion. Specifically, the insulator 121 is provided to cover part of the top of the semiconductor 141 and the conductor 152 on the side surfaces of the opening portion.

The insulator 121 functions as a gate insulating film of the transistor 900.

For the insulator 121, silicon oxide or silicon oxynitride can be used, for example. In particular, when a metal oxide is used for the semiconductor 142 described later, the insulator 121 is preferably a material which releases oxygen by heating. When the insulator 121 containing oxygen is provided in contact with the metal oxide used for the semiconductor 142, oxygen vacancies in the metal oxide can be reduced, which can improve the reliability of the transistor 900.

Although there is no particular limitation on the deposition method of the insulator 121, a deposition method of a film with good coverage is required since the insulator 121 is formed on the side surfaces of the opening portion provided in the insulator 112, the conductor 152, and the insulator 113. Examples of the deposition method of a film with good coverage include an ALD method.

The insulator 131 is provided to be in contact with part of the side surfaces of the opening portion. Specifically, the insulator 131 is provided to cover the conductor 153 to the conductor 155 on the side surfaces of the opening portion. Thus, the insulator 131 is provided to cover the insulator 114 and the insulator 115 on the side surfaces of the opening portion.

The insulator 132 is provided to be in contact with the insulator 131. The insulator 133 is provided in contact with the insulator 132. That is, the insulator 131 to the insulator 133 are sequentially stacked in this order from the side surfaces to the center of the opening portion.

The insulator 131 functions as a gate insulating film of the transistor 800. The insulator 132 functions as a charge accumulation layer of the transistor 800. The insulator 133 functions as a tunnel insulating film of the transistor 800.

It is preferable to use silicon oxide or silicon oxynitride for the insulator 131, for example. Alternatively, for the insulator 131, aluminum oxide, hafnium oxide, or an oxide containing aluminum and hafnium can be used, for example. The insulator 131 may be an insulator including a stack of any of the above. When the insulator 131 is made thicker than the insulator 133, charge can be moved from the semiconductor 142, which is described later, to the insulator 132 through the insulator 133.

It is possible to use silicon nitride or silicon nitride oxide as the insulator 132, for example. Note that a material which can be used for the insulator 132 is not limited thereto.

It is preferable to use silicon oxide or silicon oxynitride for the insulator 133, for example. Alternatively, for the insulator 133, aluminum oxide, hafnium oxide, or an oxide containing aluminum and hafnium may be used, for example. The insulator 133 may be an insulator including a stack of any of the above.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 122 is provided to be in contact with part of the side surfaces of the opening portion. Specifically, the insulator 122 is provided to cover the conductor 156 on the side surfaces of the opening portion.

The insulator 122 functions as a gate insulating film of the transistor 700.

The insulator 122 can be formed using a material similar to that of the insulator 121, for example. The insulator 122 can be formed by a method similar to that of the insulator 121.

The semiconductor 142 is provided to be in contact with the side surfaces of the insulator 121, the insulator 133, and the insulator 122 in the opening portion.

The semiconductor 142 functions as channel formation regions of the transistor 700, the transistor 800, and the transistor 900 and a wiring electrically connecting the transistor 700, the transistor 800, and the transistor 900 in series.

For the semiconductor 142, silicon is preferably used, for example. As silicon, single crystal silicon, hydrogenated amorphous silicon, microcrystalline silicon, or polycrystalline silicon can be used, for example. For the semiconductor 142, a metal oxide can be used other than silicon in some cases. Alternatively, Ge or a compound semiconductor such as ZnSe, CdS, GaAs, InP, GaN, SiGe, or the like can be used in some cases.

The semiconductor 143 is provided to fill the opening portion after the semiconductor 141, the semiconductor 142, the insulator 121, the insulator 122, the insulator 131, the insulator 132, and the insulator 133 are formed in the opening portion. Specifically, the semiconductor 143 is provided to be on the insulator 122 and the semiconductor 142, and to be in contact with the side surfaces of the insulator 117.

The semiconductor 143 is preferably a material similar to that of the semiconductor 141, for example. Thus, the polarity of the semiconductor 141 and the polarity of the semiconductor 143 are preferably the same with each other.

Note that the structure of the memory device 100 according to one embodiment of the present invention is not limited to that of the NAND memory element included in the memory cell portion MCL illustrated in FIG. 6. The NAND memory element used in the memory device 100 may have a structure different from that of the NAND memory element illustrated in FIG. 6.

<Structure Example of Circuit Layer A1>

An insulator 382 and an insulator 384 are provided to be stacked in this order above the insulator 117 (see FIG. 6 or FIG. 7). Furthermore, a conductor 386 is formed in the insulator 382 and the insulator 384. The conductor 386 has a function of a plug or a wiring. Note that the conductor 386 can be provided using a material similar to those for the conductor 328 and the conductor 330.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

The insulator 510 and the insulator 514 are preferably formed using, for example, a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIG. 8A and FIG. 8B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 8A and FIG. 8B, an insulator 544 is preferably positioned between the insulator 580 and the oxide 530a, the oxide 530b, the conductor 542a, and the conductor 542b. In addition, as illustrated in FIG. 8A and FIG. 8B, the conductor 560 preferably includes a conductor 560a provided inside the insulator 550 and a conductor 560b provided to be embedded inside the conductor 560a. As illustrated in FIG. 8A and FIG. 8B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

Note that the transistor 500 having a structure in which three layers of the oxide 530a, the oxide 530b, and the oxide 530c are stacked in the region where the channel is formed and its vicinity is illustrated; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 having a stacked-layer structure of two layers in the transistor 500 is illustrated, the present invention is not limited thereto. For example, the conductor 560 may have a single-layer structure or a stacked-layer structure of three or more layers. The transistor 500 illustrated in FIG. 7, FIG. 8A, and FIG. 8B is an example, and the structure is not limited thereto; an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the memory device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate electrode. In addition, the conductor 503 sometimes functions as a second gate electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542a and the conductor 542b functioning as the source electrode and the drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing aluminum oxide, hafnium oxide, tantalum oxide, zirconium oxide, lead zirconate titanate (PZT), strontium titanate (SrTiO$_3$), (Ba,Sr)TiO$_3$ (BST), or the like. With miniaturization and high integration of transistors, a problem such as leakage current might arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator that is a high-k material is combined with silicon oxide or silicon oxynitride, the insulator 520 having a stacked-layer structure that has thermal stability and a high relative permittivity can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used for the oxide 530 including the channel formation region. For example, as the oxide 530, a metal oxide such as an In-M-Zn oxide (the element M is one or more kinds selected from aluminum, gallium, yttrium, copper, vanadium, beryllium, boron, tin, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as an oxide semiconductor may be formed by a sputtering method, an atomic layer deposition (ALD) method, or a chemical vapor deposition (CVD) method such as a metal organic chemical vapor deposition (MOCVD) method. The metal oxide functioning as an oxide semiconductor will be described in another embodiment.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier density of the metal oxide in the channel formation region is not particularly limited and can be, for example, $1 \times 10^{-9}$ cm$^{-3}$.

When a metal oxide is used as the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as an MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel formation region in the oxide 530 has a band gap of preferably 2 eV or larger, further preferably 2.5 eV or larger. With the use of a metal oxide having such a wide band gap, the off-state current of the transistor can be reduced.

Semiconductor materials that can be used for the oxide 530 are not limited to the above metal oxides. A semiconductor material having a band gap (a semiconductor material that is not a zero-gap semiconductor) may be used for the oxide 530. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 8A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 is provided to cover a side surface of the oxide 530 and a side surface of the insulator 524 and to be in contact with the insulator 522. Alternatively, the insulator 544 is not necessarily in contact with the insulator 522, and the insulator 524 may be provided between the insulator 522 and the insulator 544. In that case, the insulator 544 is provided to cover the side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used for the insulator 544. Alternatively, silicon nitride may be used for the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or is a material that does not significantly lose its conductivity even after absorbing oxygen. Design is appropriately set in consideration of required transistor characteristics.

The insulator 550 functions as a gate insulating film. The insulator 550 is preferably positioned in contact with an inner side (a top surface and a side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode has a two-layer structure in FIG. 8A and FIG. 8B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. Furthermore, the conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening in the insulator 580 is formed to overlap with the region between the conductor 542a and the conductor 542b. Accordingly, the conductor 560 is formed to be embedded in the opening in the insulator 580 and the region between the conductor 542a and the conductor 542b.

The gate length needs to be short for miniaturization of the memory device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, an excess-oxygen region can be provided in the insulator 550 and the insulator 580. Thus, oxygen can be supplied from the excess-oxygen region to the oxide 530.

For the insulator 574, a metal oxide containing one or more kinds selected from hafnium, aluminum, gallium, yttrium, zirconium, tungsten, titanium, tantalum, nickel, germanium, magnesium, and the like can be used, for example.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to the structures of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600 and the transistor 500. The conductor 546 and the conductor 548 can be provided using a material similar to those for the conductor 328 and the conductor 330.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 having a single-layer structure are illustrated in FIG. 7, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a memory device including an OS transistor. Alternatively, an OS transistor having a high on-state current can be provided. Alternatively, an OS transistor having a low off-state current can be provided. Alternatively, a memory device including an OS transistor can be miniaturized or highly integrated.

<Structure Example of Transistor>

Note that the structure of the transistor 500 described in this embodiment is not limited to the above. Examples of structures that can be used for the transistor 500 will be described below.

<Structure Example 1 of Transistor>

Figure 9A:
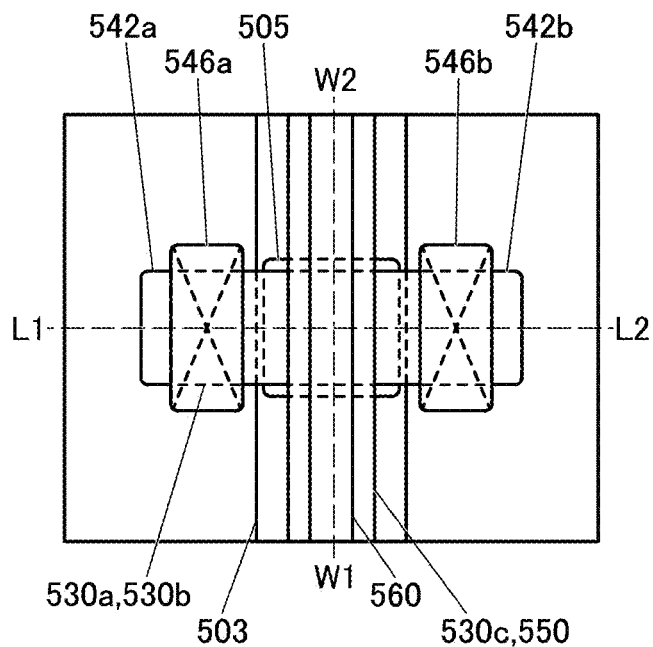
FIG. 9A is a top view illustrating a structure example of a transistor.
Figure 9C:
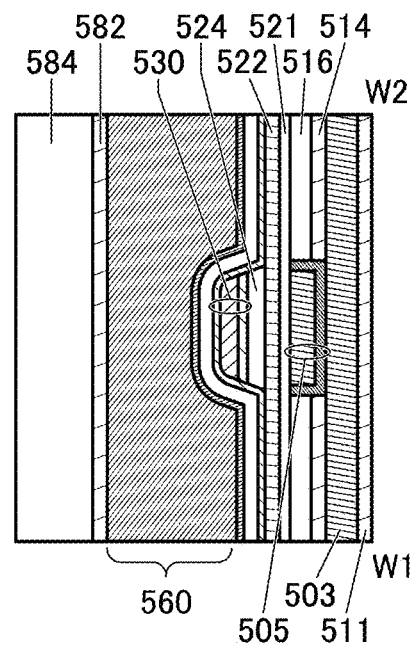
FIG. 9B and FIG. 9C are cross-sectional views illustrating the structure example of the transistor.
Figure 9B:
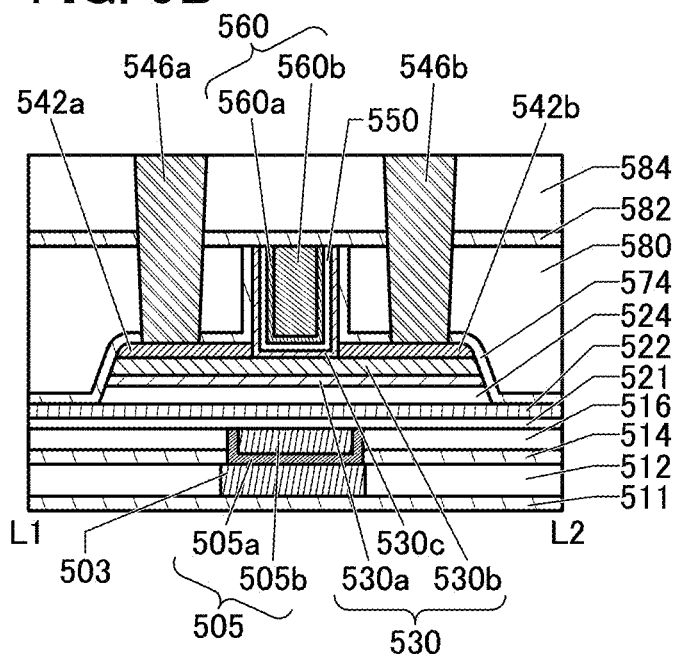

A structure example of a transistor 510A is described with reference to FIG. 9A, FIG. 9B, and FIG. 9C. FIG. 9A is a top view of the transistor 510A. FIG. 9B is a cross-sectional view of a portion indicated by dashed-dotted line L1-L2 in FIG. 9A. FIG. 9C is a cross-sectional view of a portion indicated by dashed-dotted line W1-W2 in FIG. 9A. Note that for clarity of the drawing, some components are not illustrated in the top view of FIG. 9A.

FIG. 9A, FIG. 9B, and FIG. 9C illustrate the transistor 510A and an insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 9B, the oxide 530c, the insulator 550, and the conductor 560 are positioned in an opening portion provided in the insulator 580 with the insulator 574 therebetween. Moreover, the oxide 530c, the insulator 550, and the conductor 560 are positioned between the conductor 542a and the conductor 542b.

The insulator 511 and the insulator 512 each function as an interlayer film.

As the interlayer film, a single layer or stacked layers of an insulator such as silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, tantalum oxide, zirconium oxide, lead zirconate titanate (PZT), strontium titanate ($SrTiO_3$), or (Ba, Sr)$TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, a top surface of the conductor 503 and a top surface of the insulator 512 can be substantially level with each other. Note that although the conductor 503 has a single-layer structure, the present invention is not limited thereto. For example, the conductor 503 may have a multi-layer structure of two or more layers. Note that for the conductor 503, a conductive material that has high conductivity and contains tungsten, copper, or aluminum as its main component is preferably used.

In the transistor 510A, the conductor 560 sometimes functions as a first gate electrode. The conductor 505 sometimes functions as a second gate electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap with each other, in the case where a potential is applied to the conductor 560 and the conductor 505, an electric field generated from the conductor 560 and an electric field generated from the conductor 505 are connected, so that the channel formation region formed in the oxide 530 can be covered.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, top surfaces of the conductor 505a and the conductor 505b and a top surface of the insulator 516 can be substantially level with each other. Although the transistor 510A has a structure in which the conductor 505a and the conductor 505b are stacked, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing aluminum oxide, hafnium oxide, an oxide containing aluminum and hafnium (hafnium aluminate), oxynitride containing aluminum and hafnium, tantalum oxide, zirconium oxide, lead zirconate titanate (PZT), strontium titanate ($SrTiO_3$), or $(Ba,Sr)TiO_3$ (BST), are preferably used, for example. With miniaturization and high integration of transistors, a problem such as leakage current might arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high relative permittivity.

Note that the second gate insulating film is illustrated to have a stacked-layer structure of three layers in FIG. 9B and FIG. 9C, but may have a stacked-layer structure of two or less layers or four or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion provided in the insulator 580 with the insulator 574 therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

Although a single-layer structure is illustrated in FIG. 9B, a stacked-layer structure of two or more layers may also be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530c and the insulator 574 therebetween.

With miniaturization and high integration of transistors, a problem such as leakage current might arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high relative permittivity.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the range of choices for the material of the conductor 560b can be expanded. That is, the conductor 560a inhibits oxidation of the conductor 560b, thereby preventing a decrease in conductivity.

As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance value to be a conductor. This can be referred to as an OC (Oxide Conductor) electrode.

The conductor 560b is preferably formed using a conductive material containing tungsten, copper, or aluminum as its main component. In addition, since the conductor 560 functions as a wiring, a conductor having high conductivity is preferably used as the conductor 560b. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, an OS transistor having a high on-state current can be provided. Alternatively, an OS transistor having a low off-state current can be provided. Alternatively, in a memory device including an OS transistor, variations in electrical characteristics can be inhibited and the reliability can be improved.

<Structure Example 2 of Transistor>

Figure 10A:
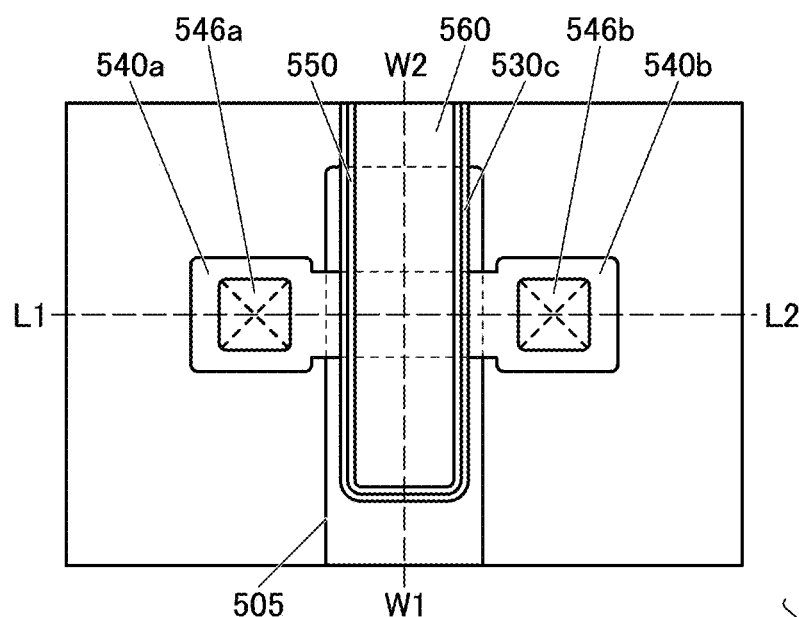
FIG. 10A is a top view illustrating a structure example of a transistor.
Figure 10C:
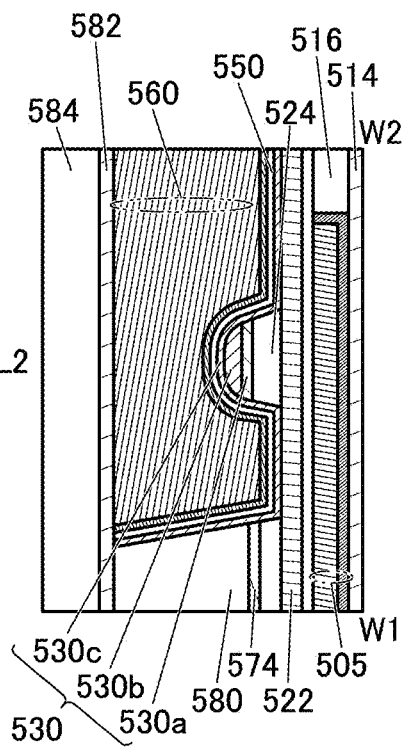
FIG. 10B and FIG. 10C are cross-sectional views illustrating the structure example of the transistor.
Figure 10B:
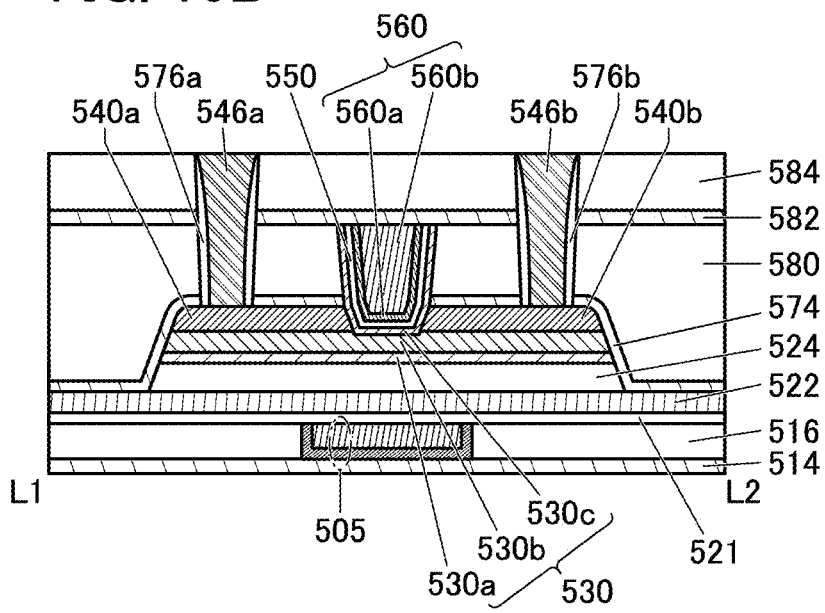

A structure example of a transistor 510B is described with reference to FIG. 10A, FIG. 10B, and FIG. 10C. FIG. 10A is a top view of the transistor 510B. FIG. 10B is a cross-sectional view of a portion indicated by dashed-dotted line L1-L2 in FIG. 10A. FIG. 10C is a cross-sectional view of a portion indicated by dashed-dotted line W1-W2 in FIG. 10A. Note that for clarity of the drawing, some components are not illustrated in the top view of FIG. 10A.

The transistor 510B is a modification example of the transistor 510A. Therefore, differences from the above transistor will be mainly described to avoid repeated description.

In the transistor 510A, part of the insulator 574 is provided in the opening portion provided in the insulator 580 and covers a side surface of the conductor 560. Meanwhile, in the transistor 510B, an opening is formed by partly removing the insulator 580 and the insulator 574.

An insulator 576 (an insulator 576a and an insulator 576b) having a barrier property may be provided between the conductor 546 and the insulator 580. Providing the insulator 576 can inhibit oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510B is stable against high temperatures (or thermal budget) in the manufacturing process.

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably higher than the atomic proportion of the element M in the constituent elements in the metal oxide used as the oxide 530b. Moreover, the atomic ratio of the element M to In in the metal oxide used as the oxide 530c is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide with In:Ga:Zn=1:3:4 [atomic ratio] or 1:1:0.5 [atomic ratio] is used. As the oxide 530b, a metal oxide with In:Ga:Zn=4:2:3 [atomic ratio] or 3:1:2 [atomic ratio] is used. As the oxide 530c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510B can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable memory device can be provided.

A metal oxide functioning as an oxide semiconductor is preferably used as the oxide 530. For example, as the metal oxide to be the channel formation region in the oxide 530, a metal oxide having a band gap of 2 eV or larger, preferably 2.5 eV or larger is preferably used. With the use of a metal oxide having such a wide band gap, the off-state current of the transistor can be reduced. With such a transistor, a memory device with low power consumption can be provided.

<Structure Example 3 of Transistor>

A structure example of a transistor 510C is described with reference to FIG. 11A and FIG. 11B. The transistor 510C is a modification example of the transistor 500. Therefore, differences from the above transistor will be mainly described to avoid repeated description. Note that the structure illustrated in FIG. 11A and FIG. 11B can be employed for other transistors, such as the transistor 300, included in the memory device of one embodiment of the present invention.

Figure 11A:
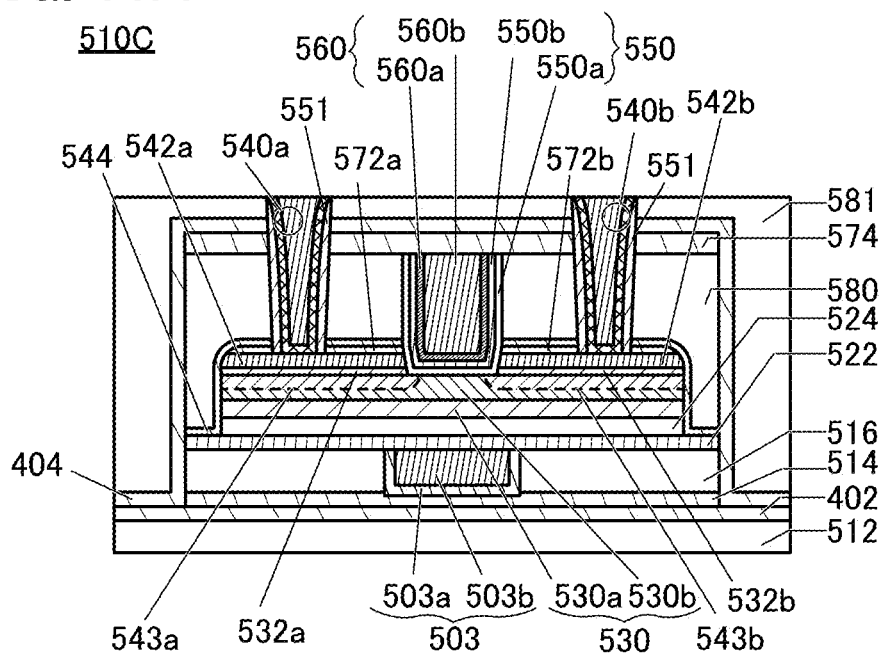
FIG. 11A and FIG. 11B are cross-sectional views illustrating a structure example of a transistor.
Figure 11B:
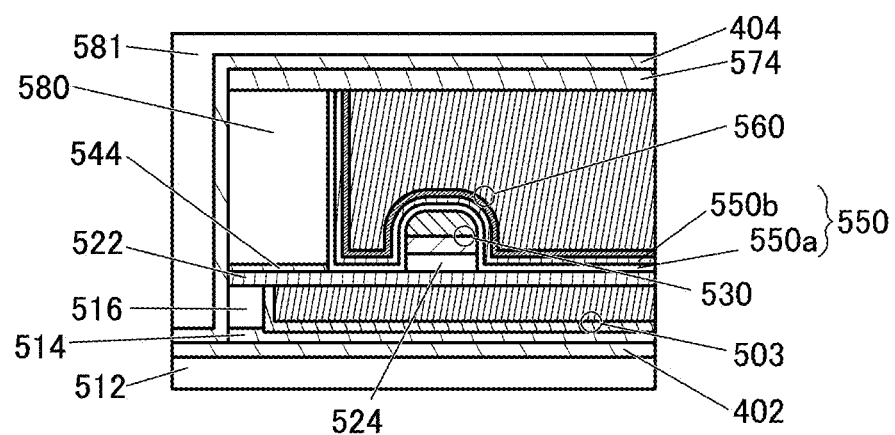

FIG. 11A is a cross-sectional view of the transistor 510C in the channel length direction, and FIG. 11B is a cross-sectional view of the transistor 510C in the channel width direction. The transistor 510C illustrated in FIG. 11A and FIG. 11B is different from the transistor 500 illustrated in FIG. 8A and FIG. 8B in that an insulator 402 and an insulator 404 are provided and the insulator 550 includes an insulator 550a and an insulator 550b. In addition, differences from the transistor 500 illustrated in FIG. 8A and FIG. 8B are that an insulator 551 is provided in contact with a side surface of the conductor 540a, the insulator 551 is provided in contact with a side surface of the conductor 540b, a conductor 572a is provided in contact with a top surface of the conductor 542a, a conductor 532a is provided in contact with a top surface of the region 543a, a conductor 572b is provided in contact with a top surface of the conductor 542b, and a conductor 532b is provided in contact with a top surface of the region 543b. Another difference from the transistor 500 illustrated in FIG. 8A and FIG. 8B is that the insulator 520 and the oxide 530c are not provided.

In the transistor 510C illustrated in FIG. 11A and FIG. 11B, the insulator 402 is provided over the insulator 512. In addition, the insulator 404 is provided over the insulator 574 and the insulator 402.

The transistor 510C illustrated in FIG. 11A and FIG. 11B has a structure in which the insulator 514, the insulator 516, the insulator 522, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 522, a side surface of the insulator 516, a side surface of the insulator 514, and a top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510C. Consequently, the reliability of the memory device including an OS transistor can be increased.

Silicon oxide, silicon oxynitride, or the like can be used for the insulator 550a, and hafnium oxide or the like can be used for the insulator 550b, for example. Thus, oxidation of the conductor 560 can be inhibited. For the conductor 572a and the conductor 572b, aluminum oxide, hafnium oxide, an oxide containing aluminum and hafnium (hafnium aluminate), or the like can be used. For the conductor 532a and the conductor 532b, a metal oxide used for the oxide 530a can be used, for example. Thus, oxidation of the conductor 542a and the conductor 542b can be inhibited.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, for the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the memory device including an OS transistor can be increased.

<Structure Example 4 of Transistor>

A structure example of a transistor 510D is described with reference to FIG. 12A and FIG. 12B. The transistor 510D is a modification example of the transistor 500. Therefore, differences from the above transistor will be mainly described to avoid repeated description. Note that the structure illustrated in FIG. 12A and FIG. 12B can be employed for other transistors, such as the transistor 300, included in the memory device of one embodiment of the present invention.

Figure 12A:
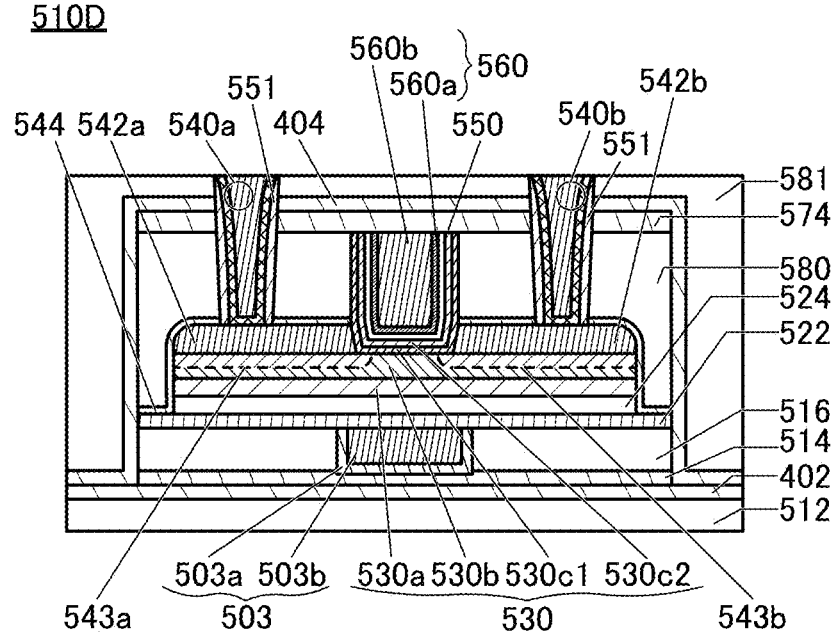
FIG. 12A and FIG. 12B are cross-sectional views illustrating a structure example of a transistor.
Figure 12B:
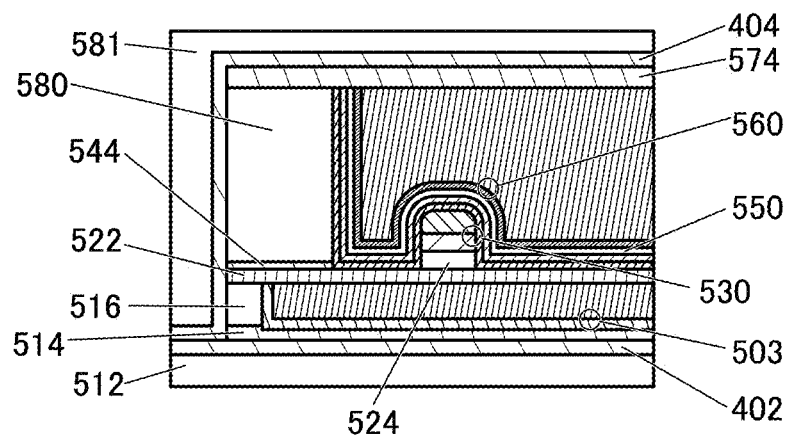

FIG. 12A and FIG. 12B illustrate a modification example of the transistor illustrated in FIG. 8A and FIG. 8B. FIG. 12A is a cross-sectional view of the transistor in the channel length direction, and FIG. 12B is a cross-sectional view of the transistor in the channel width direction. The transistor illustrated in FIG. 12A and FIG. 12B is different from the transistor 500 illustrated in FIG. 8A and FIG. 8B in including the insulator 402 and the insulator 404. Another difference from the transistor 500 illustrated in FIG. 8A and FIG. 8B is that the insulator 551 is provided in contact with the side surface of the conductor 540a and the insulator 551 is provided in contact with the side surface of the conductor 540b. Another difference from the transistor 500 illustrated in FIG. 8A and FIG. 8B is that the insulator 520 is not provided. Another difference from the transistor illustrated in FIG. 8A and FIG. 8B is that the oxide 530c has a two-layer structure of an oxide 530c1 and an oxide 530c2.

In the transistor 510D illustrated in FIG. 12A and FIG. 12B, the insulator 402 is provided over the insulator 512. In addition, the insulator 404 is provided over the insulator 574 and the insulator 402.

The transistor 510D illustrated in FIG. 12A and FIG. 12B has a structure in which the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510D. Consequently, the reliability of the memory device including an OS transistor can be increased.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, for the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the memory device including an OS transistor can be increased.

The oxide 530c1 is in contact with a top surface of the insulator 522, the side surface of the insulator 524, a side surface of the oxide 530a, a top surface and a side surface of the oxide 5530b, side surfaces of the conductor 542a and the conductor 542b, the side surface of the insulator 544, and the side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor illustrated in FIG. 8A and FIG. 8B can also have a two-layer structure of the oxide 530c1 and the oxide 530c2.

The transistor illustrated in FIG. 12A and FIG. 12B can be employed for the transistor 500, the transistor 300, or both thereof.

Note that the composition, structure, method, and the like described in this embodiment can be used in appropriate combination with the compositions, structures, methods, and the like described in the other embodiments and the like.

Embodiment 3

In this embodiment, an oxide semiconductor that is a kind of metal oxide will be described.

The metal oxide preferably contains at least indium or zinc. In particular, indium and zinc are preferably contained. In addition, one or more kinds selected from aluminum, gallium, yttrium, tin, and the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor is described with reference to FIG. 13A. FIG. 13A is a diagram showing the classification of crystal structures of an oxide semiconductor, typically IGZO (a metal oxide containing In, Ga, and Zn).

As shown in FIG. 13A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 13A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. Here, FIG. 13B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 13B and obtained by GIXD measurement is hereinafter simply referred to as an XRD spectrum. The CAAC-IGZO film shown in FIG. 13B has a composition in the vicinity of In:Ga:Zn=4:2:3 [atomic ratio]. The CAAC-IGZO film shown in FIG. 13B has a thickness of 500 nm.

In FIG. 13B, the horizontal axis represents 2θ [deg.], and the vertical axis represents intensity [a.u.]. As shown in FIG. 13B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 13B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 13C shows a diffraction pattern of the CAAC-IGZO film. FIG. 13C shows a diffraction pattern obtained with the NBED method in which an electron beam is incident in the direction parallel to the substrate. The composition of the CAAC-IGZO film shown in FIG. 13C is In:Ga:Zn=4:2:3 [atomic ratio] or the neighborhood thereof. In the nanobeam electron diffraction method, electron diffraction is performed with a probe diameter of 1 nm.

As shown in FIG. 13C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 13A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M, Zn) layer) are stacked. Indium and the element M can be replaced with each other. Therefore, indium may be contained in the (M, Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2 θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (or thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), a high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier density is preferably used for the transistor (for more specifics, refer to Embodiment 2). In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier density may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charges trapped by the trap states in the oxide semiconductor take a long time to disappear and might behave like fixed charges. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by SIMS) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier density. As a result, a transistor using, as a semiconductor, an oxide semiconductor containing nitrogen is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible (for more specifics, refer to Embodiment 2).

When an oxide semiconductor with sufficiently reduced impurities is used for the channel formation region of the transistor, stable electrical characteristics can be given.

Note that the composition, structure, method, and the like described in this embodiment can be used in appropriate combination with the compositions, structures, methods, and the like described in the other embodiments and the like.

Embodiment 4

In this embodiment, examples of a semiconductor wafer where the memory device or the like described in the above embodiment is formed and electronic components incorporating the memory device will be described.

<Semiconductor Wafer>

First, an example of a semiconductor wafer where a memory device or the like is formed is described with reference to FIG. 14A.

Figure 14A:
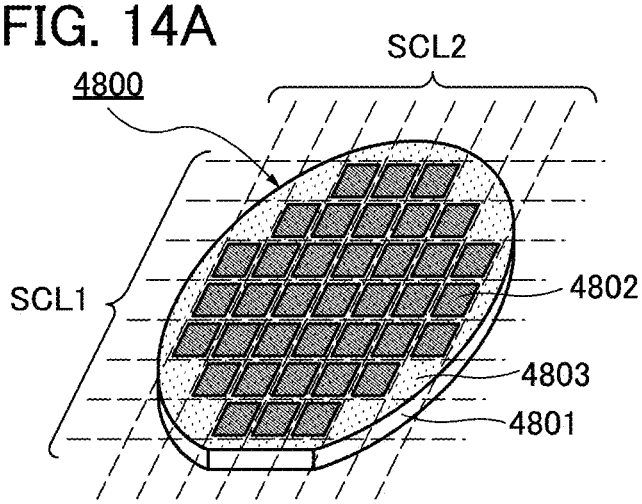
FIG. 14A is a perspective view illustrating an example of a semiconductor wafer.

A semiconductor wafer 4800 illustrated in FIG. 14A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 14B:
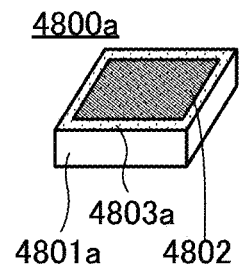
FIG. 14B is a perspective view illustrating an example of a chip.

With the dicing step, a chip 4800a as illustrated in FIG. 14B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 14A. The element substrate may be a rectangular semiconductor wafer, for example. The shape of the element substrate can be changed as appropriate, depending on a manufacturing process of an element and an apparatus for manufacturing the element.

<Electronic Component>

Figure 14C:
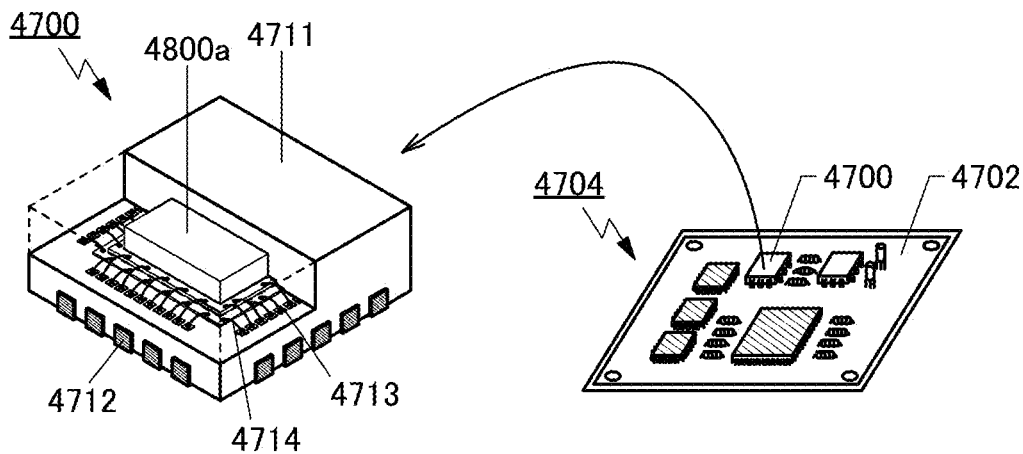
FIG. 14C and FIG. 14D are perspective views illustrating examples of electronic components.

FIG. 14C is a perspective view of an electronic component 4700 and a substrate (a mounting board 4704) on which the electronic component 4700 is mounted. The electronic component 4700 illustrated in FIG. 14C includes the chip 4800a in a mold 4711. As the chip 4800a, the memory device of one embodiment of the present invention can be used, for example.

To illustrate the inside of the electronic component 4700, some portions are omitted in FIG. 14C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 14D:
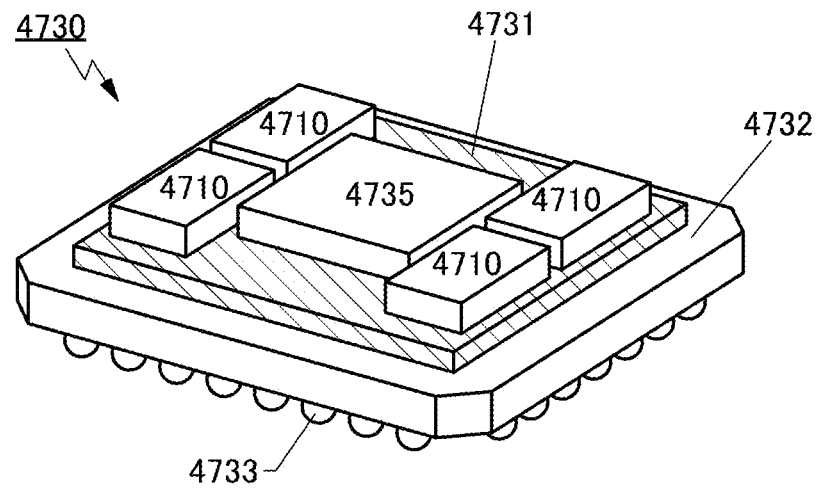

FIG. 14D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of memory devices 4710 are provided on the interposer 4731.

Examples of the memory device 4710 include the chip 4800a, the memory device described in the above embodiment, and a high bandwidth memory (HBM). An integrated circuit such as a CPU, a GPU, an FPGA, or a memory device can be used as the semiconductor device 4735. Note that in this specification and the like, a semiconductor device generally means a device that can function by utilizing semiconductor characteristics.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Moreover, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the memory devices 4710 and the semiconductor device 4735 are preferably equal to each other.

To mount the electronic component 4730 on another substrate, an electrode 4733 may be provided on the bottom portion of the package substrate 4732. FIG. 14D illustrates an example where the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments described in this specification as appropriate.

Embodiment 5

In this embodiment, application examples of the memory device of one embodiment of the present invention will be described.

The memory device of one embodiment of the present invention can be used, for example, as memory devices of a variety of electronic devices (e.g., information terminals, computers, smartphones, e-book readers, digital still cameras, video cameras, video recording/reproducing devices, navigation systems, and game machines). The memory device of one embodiment of the present invention can also be used for image sensors, IoT (Internet of Things) terminal devices, healthcare, and the like. Here, the computers refer not only to tablet computers, notebook computers, and desktop computers, but also to large computers such as server systems.

Examples of an electronic device including the memory device of one embodiment of the present invention will be described. FIG. 15A to FIG. 15J and FIG. 16A to FIG. 16E each illustrate that the electronic component 4700 or the electronic component 4730, each of which includes the memory device, is included in an electronic device.

[Mobile Phone]

Figure 15A:
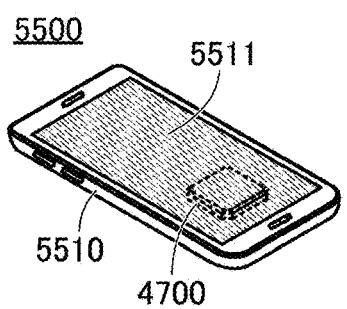
FIG. 15A to FIG. 15J are each a perspective view or a schematic view illustrating an example of an electronic device.

An information terminal 5500 illustrated in FIG. 15A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the memory device of one embodiment of the present invention, the information terminal 5500 can retain a temporary file generated at the time of executing an application (e.g., a web browser's cache).

[Wearable Terminal]

Figure 15B:
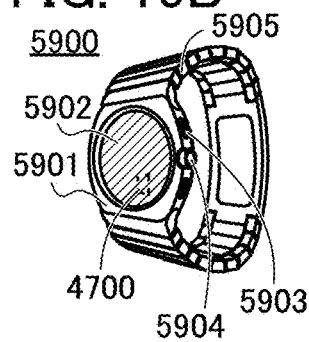

FIG. 15B illustrates an information terminal 5900 as an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by using the memory device of one embodiment of the present invention.

[Information Terminal]

Figure 15C:
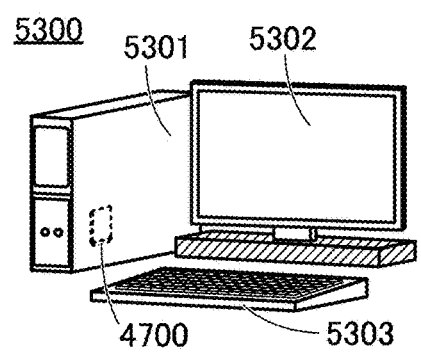

FIG. 15C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application by using the memory device of one embodiment of the present invention.

Note that although the smartphone, the wearable terminal, and the desktop information terminal are respectively illustrated in FIG. 15A to FIG. 15C as examples of the electronic device, one embodiment of the present invention can be applied to an information terminal other than a smartphone, a wearable information terminal, and a desktop information terminal. Examples of an information terminal other than a smartphone, a wearable terminal, and a desktop information terminal include a PDA (Personal Digital Assistant), a laptop information terminal, and a workstation.

[Household Appliance]

Figure 15D:
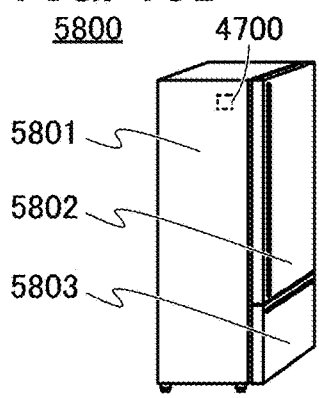

FIG. 15D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is compatible with IoT (Internet of Things).

The memory device of one embodiment of the present invention can be used in the electric refrigerator-freezer 5800. The electric refrigerator-freezer 5800 can transmit and receive data on food stored in the electric refrigerator-freezer 5800 and food expiration dates, for example, to/from an information terminal and the like via the Internet. In the electric refrigerator-freezer 5800, the memory device can retain a temporary file generated at the time of transmitting the data.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 15E:
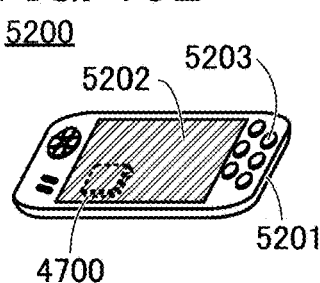

FIG. 15E illustrates a portable game machine 5200 that is an example of a game machine. The portable game machine 5200 includes a housing 5201, a display portion 5202, a button 5203, and the like.

Figure 15F:
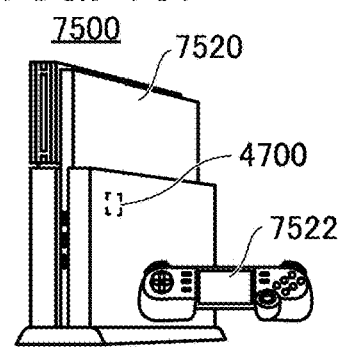

FIG. 15F illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 15F, the controller 7522 can include a display portion that displays a game image, and an input interface besides a button, such as a touch panel, a stick, a rotating knob, and a sliding knob, for example. The shape of the controller 7522 is not limited to that illustrated in FIG. 15F, and may be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

The memory device described in the above embodiment is used for the portable game machine 5200 or the stationary game machine 7500, whereby the portable game machine 5200 or the stationary game machine 7500 can have low power consumption. Moreover, heat generation from a circuit can be reduced owing to low power consumption; thus, the influence of heat generation on the circuit itself, a peripheral circuit, and a module can be reduced.

Moreover, with the use of the memory device described in the above embodiment, the portable game machine 5200 or the stationary game machine 7500 can retain a temporary file necessary for arithmetic operation that occurs during game play.

Although FIG. 15E illustrates the portable game machine and FIG. 15F illustrates the stationary game machine as examples of game machines, the electronic device of one embodiment of the present invention is not limited thereto. Examples of the electronic device of one embodiment of the present invention include an arcade game machine installed in entertainment facilities (e.g., a game center and an amusement park), and a throwing machine for batting practice installed in sports facilities.

[Moving Vehicle]

The memory device described in the above embodiment can be used for an automobile, which is a moving vehicle, and around the driver's seat in an automobile.

Figure 15G:
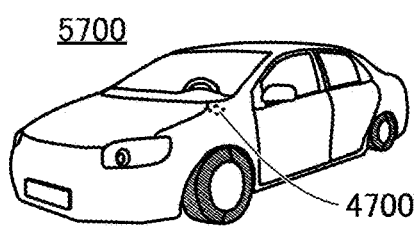

FIG. 15G illustrates an automobile 5700 that is an example of a moving vehicle.

An instrument panel that provides various kinds of information by displaying a speedometer, a tachometer, a mileage, a fuel meter, a gearshift state, and air-conditioning settings is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, which improves safety. That is, display of an image taken by an imaging device provided on the outside of the automobile 5700 can fill in blind areas and improve safety.

The memory device described in the above embodiment can temporarily retain data, and thus can be used to retain temporary data necessary in an automatic driving system for the automobile 5700 and a system for navigation and risk prediction, for example. The display device may be configured to display temporary information regarding navigation, risk prediction, or the like. Moreover, the memory device may be configured to retain a video taken by a driving recorder provided in the automobile 5700.

Although an automobile is described above as an example of a moving vehicle, a moving vehicle is not limited to an automobile. Examples of moving vehicles include a train, a monorail train, a ship, and a flying object (a helicopter, an unmanned aircraft (a drone), an airplane, and a rocket).

[Camera]

The memory device described in the above embodiment can be used in a camera.

Figure 15H:
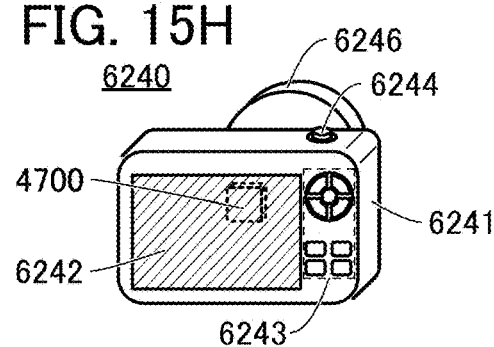

FIG. 15H illustrates a digital camera 6240 that is an example of an imaging device. The digital camera 6240 includes a housing 6241, a display portion 6242, operation switches 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the memory device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The memory device described in the above embodiment can be used in a video camera.

Figure 15I:
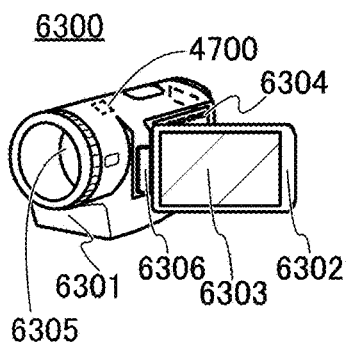

FIG. 15I illustrates a video camera 6300 that is an example of an imaging device. The video camera 6300 includes a first housing 6301, a second housing 6302, a display portion 6303, an operation switch 6304, a lens 6305, a joint 6306, and the like. The operation switch 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above memory device, the video camera 6300 can retain a temporary file generated in encoding.

[ICD]

The memory device described in the above embodiment can be used in an implantable cardioverter-defibrillator (ICD).

Figure 15J:
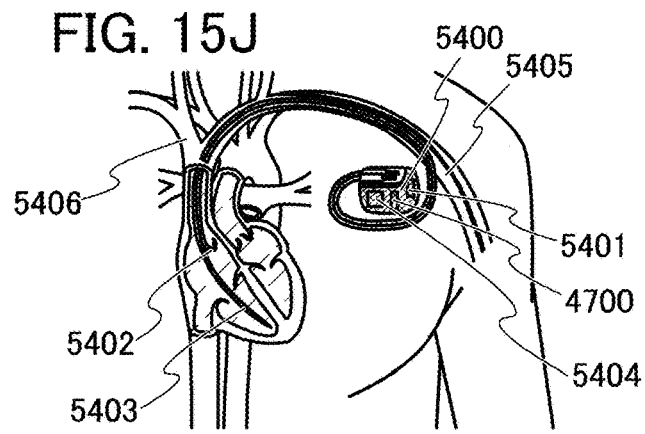

FIG. 15J is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving electric power, an antenna that can transmit physiological signals may be included to construct, for example, a system that monitors the cardiac activity by checking physiological signals such as a pulse, a respiratory rate, a heart rate, and body temperature with an external monitoring device.

[Expansion Device for PC]

The memory device described in the above embodiment can be used in a calculator such as a PC and an expansion device for an information terminal.

Figure 16A:
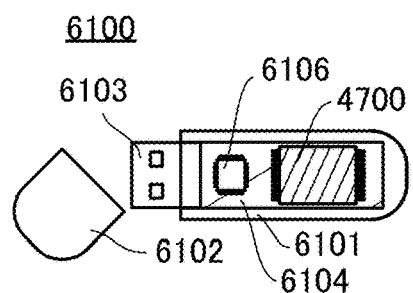
FIG. 16A to FIG. 16E are each a perspective view or a schematic view illustrating an example of an electronic device.

FIG. 16A illustrates, as an example of the expansion device, a portable expansion device 6100 that includes a chip capable of retaining data and is externally provided on a PC. The expansion device 6100 can retain data using the chip when connected to a PC with a USB, for example. FIG. 16A illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

[SD Card]

The memory device described in the above embodiment can be used in an SD card that can be attached to an electronic device such as an information terminal or a digital camera.

Figure 16B:
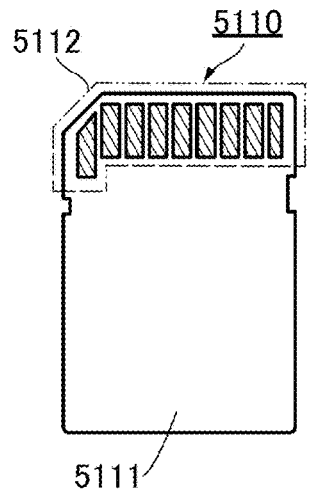
Figure 16C:
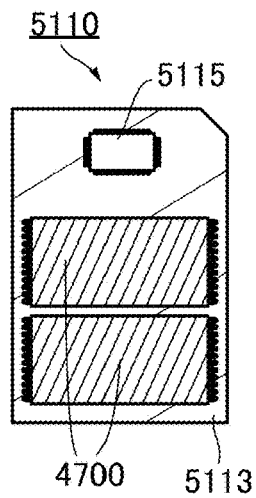

FIG. 16B is a schematic external view of an SD card, and FIG. 16C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, electronic components 4700 and a controller chip 5115 are attached to the substrate 5113. Note that the circuit configurations of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from/to the electronic components 4700.

[SSD]

The memory device described in the above embodiment can be used in an SSD that can be attached to an electronic device such as an information terminal.

Figure 16D:
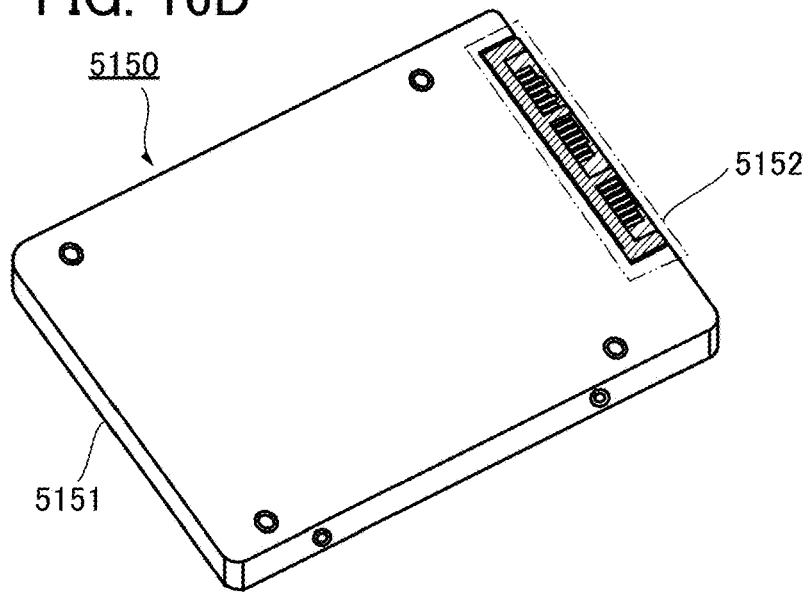
Figure 16E:
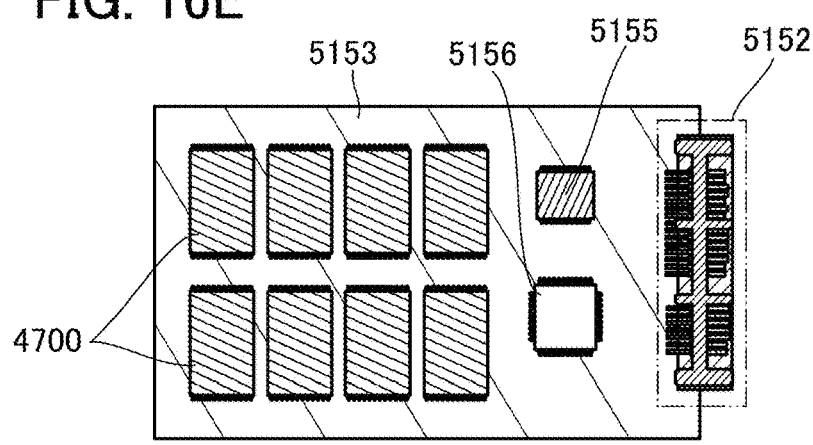

FIG. 16D is a schematic external view of an SSD, and FIG. 16E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the electronic components 4700, the memory chip 5155, and the controller chip 5156 are not limited to those described above, and can be changed as appropriate according to circumstances. For example, a memory functioning as a work memory may also be provided in the controller chip 5156.

[Computer]

Figure 17A:
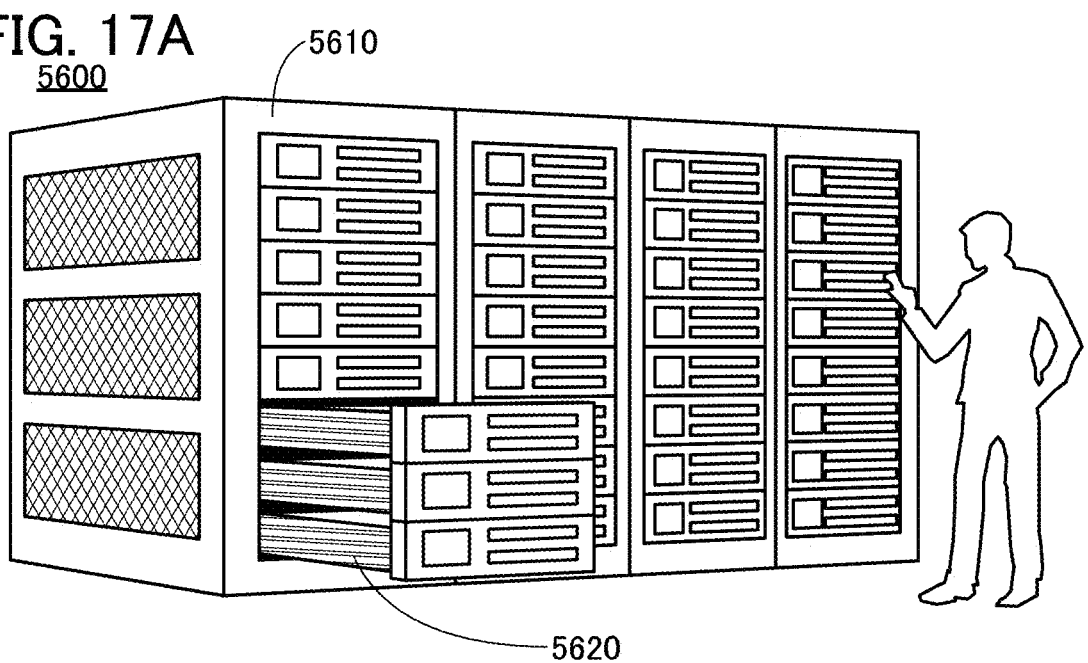
FIG. 17A to FIG. 17C are diagrams each illustrating an example of an electronic device.

A computer 5600 illustrated in FIG. 17A is an example of a large computer. In the computer 5600, a plurality of rack mount computers 5620 are stored in a rack 5610. Note that the computer 5600 may be referred to as a supercomputer.

Figure 17B:
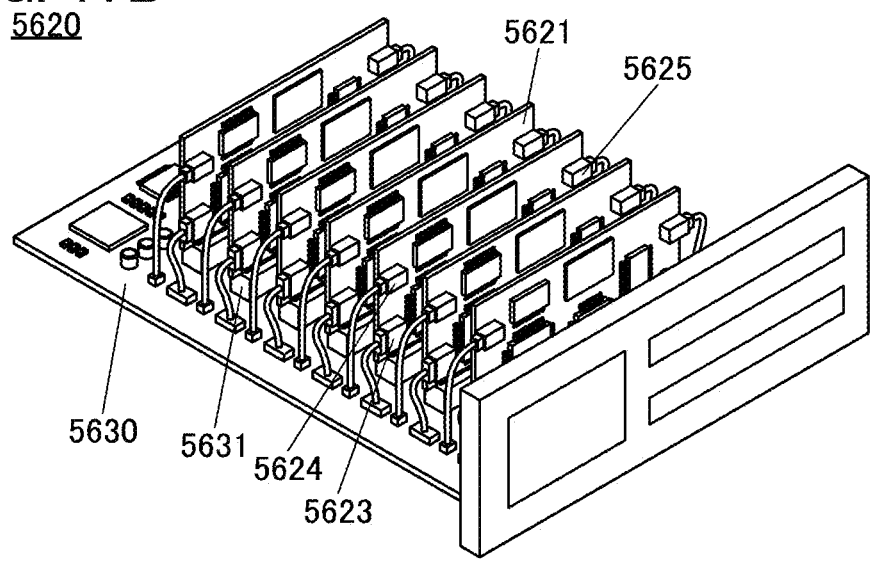

The computer 5620 can have a structure in a perspective view illustrated in FIG. 17B, for example. In FIG. 17B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 17C:
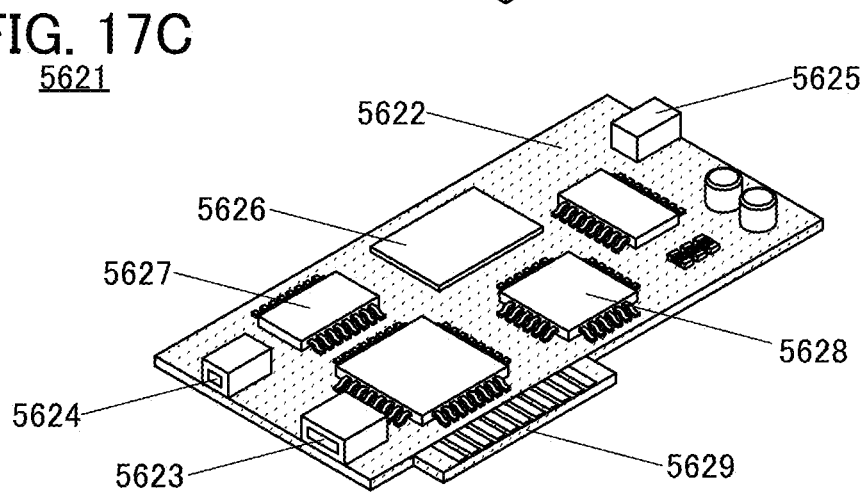

The PC card 5621 illustrated in FIG. 17C is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. FIG. 17C also illustrates semiconductor devices other than the semiconductor device 5626, the semiconductor device 5627, and the semiconductor device 5628; the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve, for example, as an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB, SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The memory device of one embodiment of the present invention is used in a variety of electronic devices described above, whereby a reduction in size, an increase in speed, or a reduction in power consumption of the electronic devices can be achieved. In addition, since the memory device of one embodiment of the present invention has low power consumption, heat generation from a circuit can be reduced. Accordingly, it is possible to reduce adverse effects of the heat generation on the circuit itself, the peripheral circuit, and the module. Furthermore, the use of the memory device of one embodiment of the present invention can achieve an electronic device that operates stably even in a high temperature environment. Thus, the reliability of the electronic devices can be increased.

Note that this embodiment can be combined with any of the other embodiments described in this specification as appropriate.

REFERENCE NUMERALS

A1: circuit layer, A2: circuit layer, A3: wiring layer, BL: wiring, BLD: circuit, BSL: wiring, BTr: transistor, CA1: capacitor, CB1: capacitor, CL: wiring, CS: control signal, CTr: transistor, CTR: control circuit, CVC: circuit, DEC: decoder, DL: wiring, INV: inverter circuit, IT: terminal, IT1: terminal, IT2: terminal, M1: conductor, M2: conductor, M3: conductor, MC: memory cell, MCA: memory cell array, MCL: memory cell portion, NA: NAND circuit, NFL: NAND flash layer, OIV: inverter circuit, OSC: circuit, OT: terminal, OUTP: output circuit, PRPH: circuit, RDATA: data signal, SCL1: scribe line, SCL2: scribe line, SRG: string, SSL: wiring, STr: transistor, SUB: substrate, TrA1: transistor, TrA2: transistor, TrA3: transistor, TrA4: transistor, TrB1: transistor, TrB2: transistor, TrB3: transistor, TrB4: transistor, TrB5: transistor, TrB6: transistor, VHL: wiring, VLL: wiring, WDATA: data signal, WL: wiring, WLD: circuit, 100: memory device, 300: transistor, 311: substrate, 313: semiconductor region, 314*a*: low-resistance region, 314*b*: low-resistance region, 500: transistor, 510A: transistor, 510B: transistor, 510C: transistor, 510D: transistor, 530: oxide, 530*a*: oxide, 530*b*: oxide, 530*c*: oxide, 530*c*1: oxide, 530*c*2: oxide, 543: region, 543*a*: region, 543*b*: region, 600: capacitor, 700: transistor, 800: transistor, 900: transistor, 4700: electronic component, 4702: printed circuit board, 4704: mounting board, 4710: memory device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display portion, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5600: computer, 5610: rack, 5620: computer, 5621: PC card, 5622: board, 5623: connection terminal, 5624: connection terminal, 5625: connection terminal, 5626: semiconductor device, 5627: semiconductor device, 5628: semiconductor device, 5629: connection terminal, 5630: motherboard, 5631: slot, 5700: automobile, 5800: electric refrigerator-freezer, 5801: housing, 5802: refrigerator door, 5803: freezer door, 5900: information terminal, 5901: housing, 5902: display portion, 5903: operation switch, 5904: operation switch, 5905: band, 6100: expansion device, 6101: housing, 6102: cap, 6103: USB connector, 6104: substrate, 6106: controller chip, 6240: digital camera, 6241: housing, 6242: display portion, 6243:

operation switch, 6244: shutter button, 6246: lens, 6300: video camera, 6301: housing, 6302: housing, 6303: display portion, 6304: operation switch, 6305: lens, 6306: joint, 7500: stationary game machine, 7520: main body, 7522: controller

The invention claimed is:

1. A memory device comprising:
a first layer;
a second layer; and
a third layer,
wherein a decoder is provided in the first layer,
wherein a memory cell portion is provided in the second layer,
wherein a circuit is provided in the third layer,
wherein the circuit is configured to control the decoder and the memory cell portion,
wherein the decoder is configured to select or deselect part of the memory cell portion,
wherein at least part of the second layer is provided to be stacked above the third layer, and
wherein at least part of the first layer is provided to be stacked above the second layer.

2. The memory device according to claim 1,
wherein the third layer comprises a single crystal silicon substrate,
wherein the circuit comprises a first transistor formed using the single crystal silicon substrate,
wherein the decoder comprises a second transistor, and
wherein the second transistor comprises a metal oxide in a channel formation region.

3. The memory device according to claim 1,
wherein the third layer comprises an SOI substrate,
wherein the circuit comprises a first transistor formed using the SOI substrate,
wherein the decoder comprises a second transistor, and
wherein the second transistor comprises a metal oxide in a channel formation region.

4. An electronic device comprising the memory device according to claim 1.

5. A memory device comprising:
a first layer;
a second layer; and
a third layer,
wherein a decoder is provided in the first layer,
wherein a memory cell portion is provided in the second layer,
wherein a circuit is provided in the third layer,
wherein the circuit is configured to control the decoder and the memory cell portion,
wherein the circuit is configured to output a selection signal to the decoder,
wherein the memory cell portion comprises a NAND memory element having a three-dimensional structure,
wherein the decoder is configured to output a signal for selecting or deselecting part of the memory cell portion to the memory cell portion in accordance with the selection signal,
wherein at least part of the second layer is provided to be stacked above the third layer, and
wherein at least part of the first layer is provided to be stacked above the second layer.

6. The memory device according to claim 5,
wherein the third layer comprises a single crystal silicon substrate,
wherein the circuit comprises a first transistor formed using the single crystal silicon substrate,
wherein the decoder comprises a second transistor, and
wherein the second transistor comprises a metal oxide in a channel formation region.

7. The memory device according to claim 5,
wherein the third layer comprises an SOI substrate,
wherein the circuit comprises a first transistor formed using the SOI substrate,
wherein the decoder comprises a second transistor, and
wherein the second transistor comprises a metal oxide in a channel formation region.

8. An electronic device comprising the memory device according to claim 5.

* * * * *